United States Patent
Yoshioka et al.

(10) Patent No.: US 9,577,659 B2
(45) Date of Patent: Feb. 21, 2017

(54) AMPLIFIER CIRCUIT, AD CONVERTER, WIRELESS COMMUNICATION DEVICE, AND SENSOR SYSTEM

(71) Applicant: KABUSHIKI KAISHA TOSHIBA, Minato-ku, Tokyo (JP)

(72) Inventors: Kentaro Yoshioka, Tokyo (JP); Masanori Furuta, Kanagawa (JP); Junya Matsuno, Kanagawa (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/163,916

(22) Filed: May 25, 2016

(65) Prior Publication Data
US 2016/0352349 A1 Dec. 1, 2016

(30) Foreign Application Priority Data
May 29, 2015 (JP) .................. 2015-110647

(51) Int. Cl.
| | |
|---|---|
| H03M 1/12 | (2006.01) |
| H03K 3/03 | (2006.01) |
| H03F 3/45 | (2006.01) |
| H03F 1/34 | (2006.01) |
| H04W 88/02 | (2009.01) |

(52) U.S. Cl.
CPC ............... *H03M 1/124* (2013.01); *H03F 1/34* (2013.01); *H03F 3/45* (2013.01); *H03K 3/0315* (2013.01); *H03F 2200/294* (2013.01); *H04W 88/02* (2013.01)

(58) Field of Classification Search
CPC ........ H03M 3/47; H03M 3/496; H03M 1/124; H03K 3/0315; H03F 3/45
USPC .................................. 341/143–172
See application file for complete search history.

(56) References Cited

U.S. PATENT DOCUMENTS

| | | | |
|---|---|---|---|
| 6,768,436 B1* | 7/2004 | Chuang ................ | H03M 3/364 341/143 |
| 6,972,705 B1* | 12/2005 | Fei ......................... | H03M 3/39 341/143 |
| 7,253,600 B2 | 8/2007 | Lee | |
| 2003/0080888 A1* | 5/2003 | Muhammad ............ | H03M 3/47 341/143 |
| 2008/0204300 A1* | 8/2008 | Tachibana ............. | H03M 1/462 341/158 |
| 2010/0091688 A1* | 4/2010 | Staszewski .......... | H03D 7/1441 370/277 |
| 2010/0328119 A1 | 12/2010 | Kobayashi et al. | |

(Continued)

OTHER PUBLICATIONS

A. M. A. Ali, et al, "A 16-bit 250-MS/s IF Sampling Pipelined ADC With Background Calibration," IEEE JSSC, vol. 45, No. 12, 2010.

(Continued)

*Primary Examiner* — Lam T Mai
(74) *Attorney, Agent, or Firm* — Foley & Lardner LLP

(57) ABSTRACT

An amplifier circuit has a sampling circuit to comprise a sampling capacitor which samples an input voltage and a plurality of switches, a quantizer to quantize an output voltage of the sampling circuit, a DA converter to output an analog signal depending on a quantization signal by the quantizer, and a feedback capacitor to feed the analog signal back to the output voltage of the sampling circuit.

18 Claims, 23 Drawing Sheets

(56) References Cited

U.S. PATENT DOCUMENTS

| | | | | |
|---|---|---|---|---|
| 2011/0063155 A1* | 3/2011 | Chen | ............ | H03M 3/474<br>341/143 |
| 2013/0222335 A1* | 8/2013 | Lee | ............ | G11C 27/024<br>345/174 |

OTHER PUBLICATIONS

B. Hershberg et al, "Ring Amplifiers for Switched Capacitor Circuits," IEEE Journal on Solid-State Circuits, 2012.

Cao, Zhiheng, Shouli Yan, and Yunchu Li. "A 32 mW 1.25 GS/s 6b 2b/Step SAR ADC in 0.13 μm CMOS." Solid-State Circuits, IEEE Journal of 44.3 (2009): 862-873.

J. Fredenburg, "A 90-MS/s 11-MHz-Bandwidth 62-dB SNDR Noise-Shaping SAR ADC," IEEE Journal of Solid-State Circuits, 2012, 47. 12: 2898-2904.

K. Martin and A. S. Sedra, "Effects of the Op Amp Finite Gain and Bandwidth on the Performance of Switched-Capacitor Filters," IEEE Trans. Circuits Syst., vol. CAS-28, pp. 822-829, Aug. 1981.

Liu, W., Huang, P., & Chiu, Y. "A 12-bit, 45-MS/s, 3-mW Redundant Successive-Approximation-Register Analog-to-Digital Converter With Digital Calibration." IEEE Journal of Solid-State Circuits, 46 (11), 2661-2672, (2011).

M. Miyahara, et al, "A Low-Noise Self-Calibrating Dynamic Comparator for High-Speed ADCs," Proc. A-SSCC, pp. 269-272, 2008.

Shikata, Akira, et al. "A 4-10 bit, 0.4-1V Power Supply, Power Scalable Asynchronous SAR-ADC in 40 nm-CMOS with Wide Supply Voltage Range SAR Controller." IEICE Transactions on Fundamentals of Electronics, Communications and Computer Sciences 96.2 (2013).

Soon-Kyun Shin, Yong-Sang You, Seung-Hoon Lee, Kyoung-Ho Moon, Jae-Whui Kim, Lane Brooks, and Hae-Seung Lee, "A Fully-Differential Zero-Crossing-Based 1.2V 10b 26MS/s Pipelined ADC in 65nm CMOS," IEEE YLSI Circuits Symp., 2008.

Van Elzakker, Michiel, et al. "A 1.9μW 4.4fj/Conversion-step 10b 1MS/s Charge-Redistribution ADC." In IEEE International Solid-State Circuits Conference, 2008.

* cited by examiner

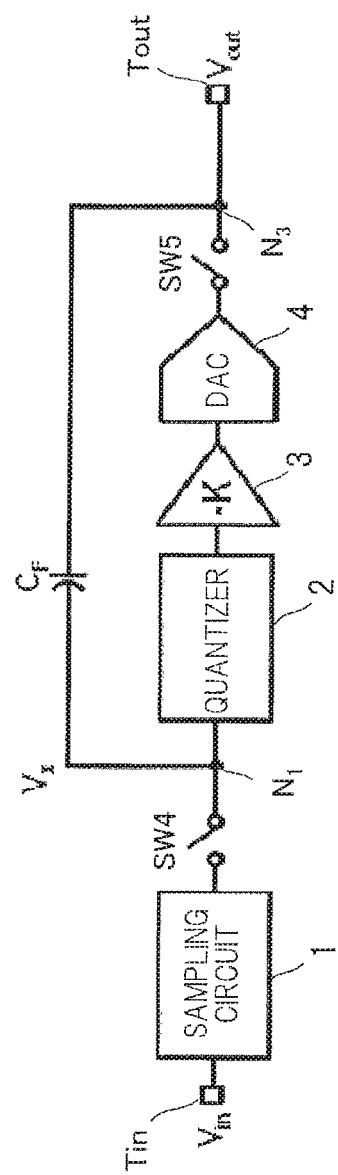
F I G. 20

AMPLIFIER CIRCUIT, AD CONVERTER, WIRELESS COMMUNICATION DEVICE, AND SENSOR SYSTEM

CROSS REFERENCE TO RELATED APPLICATIONS

This application is based upon and claims the benefit of priority from the prior Japanese Patent Application No. 2015-110647, filed on May 29, 2015, the entire contents of which are incorporated herein by reference.

FIELD

Embodiments of the present disclosure relate to an amplifier circuit, an AD converter, a wireless communication device, and a sensor system.

BACKGROUND

Conventionally, a switched capacitor circuit having an operational amplifier is known as an amplifier circuit to amplify an analog signal by a predetermined gain. In such an amplifier circuit, virtual ground voltage approaches an ideal value as the gain of the operational amplifier becomes larger, which leads to the improvement of amplification accuracy. However, in recent years, the development of miniaturization of CMOS devices has made it difficult to design an operational amplifier having a high gain. This leads to a problem that a large amplification error occurs in the above conventional amplifier circuit.

Further, an amplifier circuit having a comparator instead of the operational amplifier has been proposed. However, an amplification error depending on the finite delay of the comparator occurs in this amplifier circuit. This leads to a problem that power consumption has to be considerably increased to make the amplification error small.

BRIEF DESCRIPTION OF THE DRAWINGS

FIG. 20 is a diagram showing an example of an integrator according to a third embodiment.

DETAILED DESCRIPTION

According to one embodiment, an amplifier circuit has a sampling circuit to comprise a sampling capacitor which samples an input voltage and a plurality of switches, a quantizer to quantize an output voltage of the sampling circuit, a DA converter to output an analog signal depending on a quantization signal by the quantizer, and a feedback capacitor to feed the analog signal back to the output voltage of the sampling circuit.

First, a conventional amplifier circuit will be explained referring to FIGS. 1 to 6.

Figure 1:
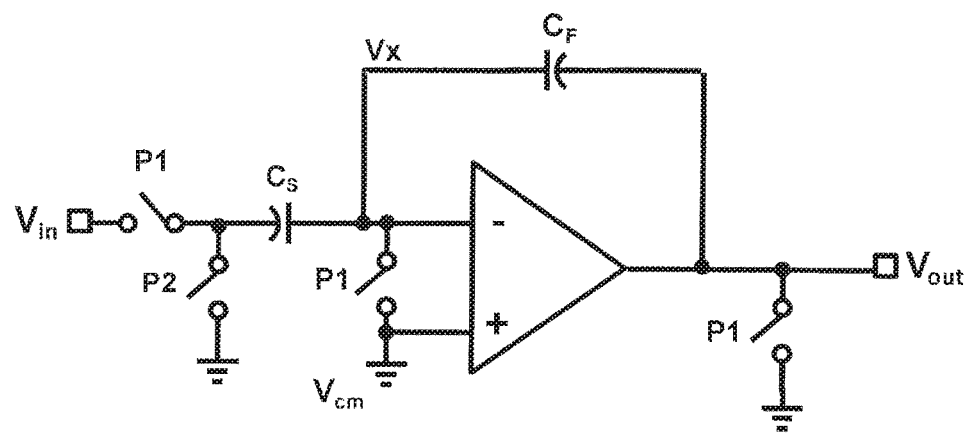
FIG. 1 is a diagram showing an example of a conventional amplifier circuit having an operational amplifier.

FIG. 1 is a diagram showing an example of a conventional amplifier circuit having an operational amplifier. As shown in FIG. 1, this amplifier circuit has a sampling circuit, an operational amplifier, a feedback capacitor $C_F$, and a reset switch P1. The sampling circuit is formed using a switched capacitor circuit having two switches P1 and P2 and a sampling capacitor $C_S$.

In the amplifier circuit of FIG. 1, in a sampling phase, the switch P1 is turned on and the switch P2 is turned off, by which sampled input voltage Vin is stored in the sampling capacitor $C_S$.

Then, in an amplification phase, the switch P1 is turned off and the switch P2 is turned on, by which the charge stored in the sampling capacitor $C_S$ is transferred to the feedback capacitor $C_F$. When the gain of the operational amplifier is infinite, a virtual ground voltage $V_X$ becomes 0 (=Vcm) and all the charge stored in the sampling capacitor $C_S$ is transferred to the feedback capacitor $C_F$. At this time, an output voltage Vout can be expressed by the following formula.

$$V\text{out} = V\text{in}\frac{C_S}{C_F} \quad (1)$$

In Formula (1), $C_S$ represents a capacitance value of the sampling capacitor $C_S$, and $C_F$ represents a capacitance value of the feedback capacitor $C_F$. As will be understood from Formula (1), the amplification factor of the amplifier circuit can be set using $C_S$ and $C_F$.

However, the gain of an actual operational amplifier is finite, which means that the virtual ground voltage $V_X$ does not become 0. When the gain of the operational amplifier is defined as A, the actual output voltage Vout can be expressed by the following formula.

$$V\text{out} = V\text{in}\frac{C_S}{C_F} \times \frac{A}{1+A} \quad (2)$$

Figure 2:
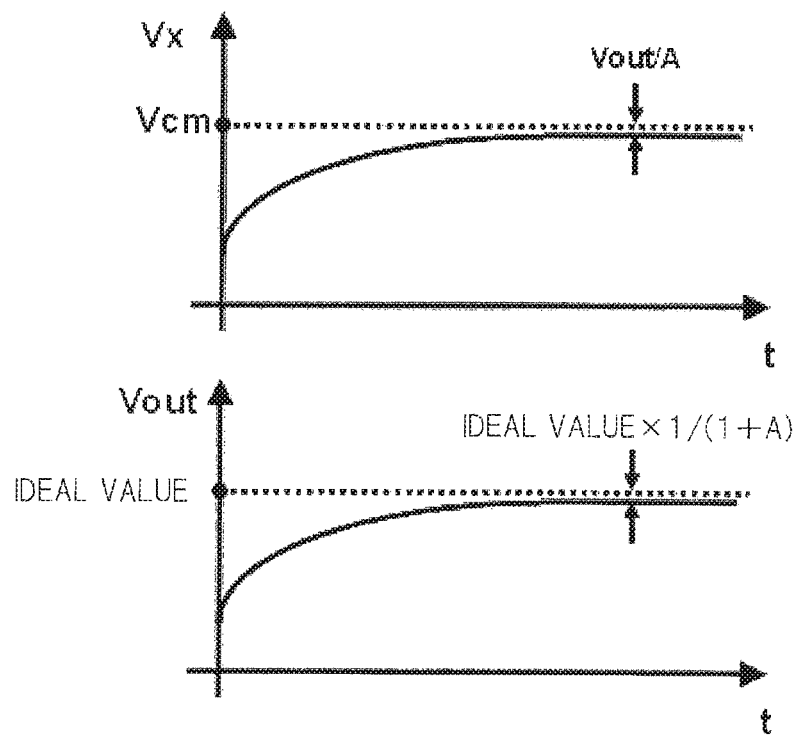
FIG. 2 is a graph showing the output voltage of the amplifier circuit of FIG. 1 in an amplification phase.

As will be understood from Formula (2), the output voltage Vout has an error corresponding to the multiplication of 1/(1+A) with respect to an ideal value (Vin×$C_S$/$C_F$). FIG. 2 is a diagram showing the virtual ground voltage $V_X$ and output voltage Vout of the amplifier circuit of FIG. 1 in the amplification phase. As shown in FIG. 2, the virtual ground voltage $V_X$ has an error corresponding to |Vout/A| with respect to a ground voltage Vcm, due to the finite gain A.

In the past, the error of the output voltage Vout was sufficiently small since an operational amplifier having a gain of about 10000 could be designed. However, since the gain of the operational amplifier has been reduced to only about 100 due to the miniaturization of CMOS devices, the error of the output voltage Vout cannot be ignored any more.

Figure 3:
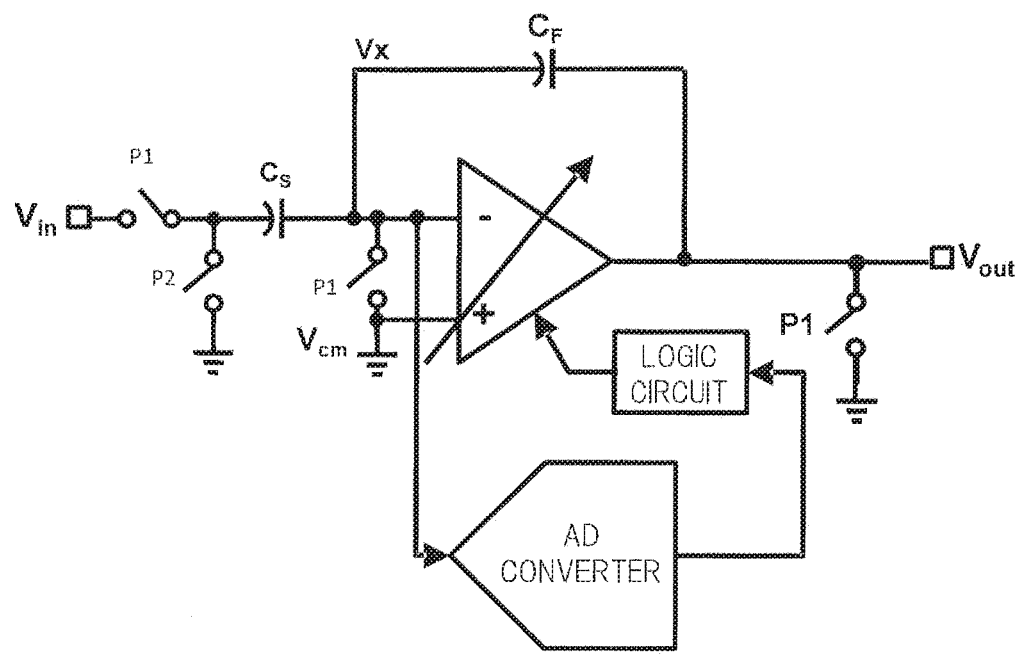
FIG. 3 is a diagram showing a modification example of the amplifier circuit of FIG. 1.

Accordingly, an amplifier circuit as shown in FIG. 3 has been proposed in order to reduce the error of the output voltage Vout. The amplifier circuit of FIG. 3 further has an AD converter (ADC) for performing Analog-to-Digital conversion on the virtual ground voltage $V_X$, and a logic circuit for controlling the parameters of the operational amplifier depending on the value obtained by the AD conversion.

Figure 4:
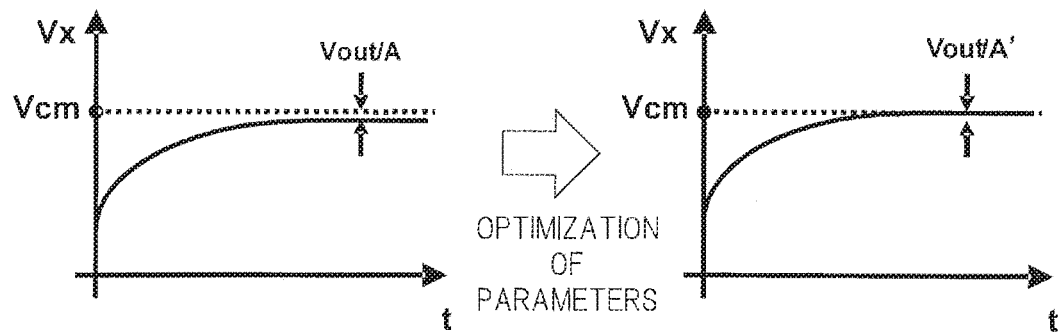
FIG. 4 is a graph showing the output voltage of the amplifier circuit of FIG. 3 in the amplification phase.

In this amplifier circuit, as shown in FIG. 4, the parameters of the operational amplifier are optimized to make the virtual ground voltage $V_X$ approach 0, by which the gain of the operational amplifier becomes equivalently large and the error of the output voltage Vout can be made small. However, since the performance of transistor devices configured by a CMOS has been deteriorated due to the miniaturization of CMOS devices, the range of optimizable parameters is limited.

Figure 5:
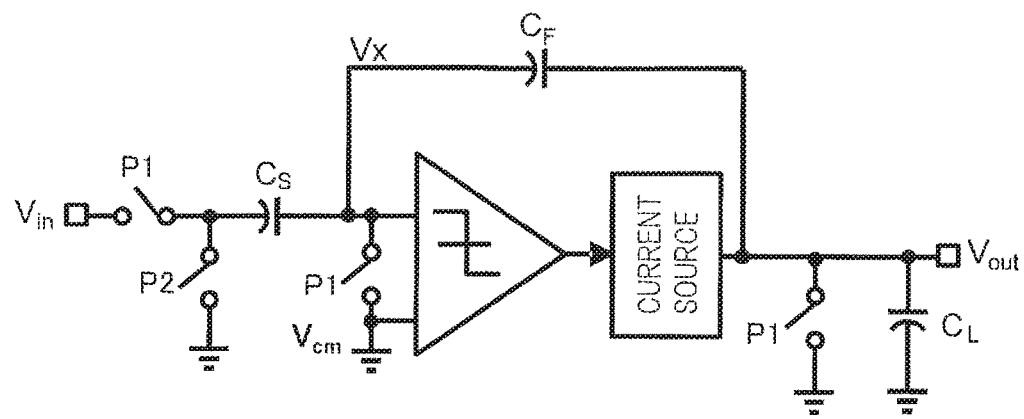
FIG. 5 is a diagram showing an example of a conventional amplifier circuit having a comparator.

FIG. 5 is a diagram showing an example of a conventional amplifier having a comparator (zero-crossing detector). As shown in FIG. 5, this amplifier circuit has the sampling circuit, a comparator, a current source, the feedback capacitor $C_F$, the reset switch P1, and a load capacitor $C_L$. The sampling circuit is formed using a switched capacitor circuit having the two switches P1 and P2 and sampling capacitor $C_S$.

In the amplifier circuit of FIG. 5, in the sampling phase, the switch P1 is turned on and the switch P2 is turned off, by which sampled input voltage Vin is stored in the sampling capacitor $C_S$.

Then, in the amplification phase, the switch P1 is turned off and the switch P2 is turned on, by which the comparator turns the current source on until the virtual ground voltage $V_X$ becomes 0 to charge the feedback capacitor $C_F$ and load capacitor $C_L$.

In the amplifier circuit of FIG. 5, ideal errorless amplification is made possible when the delay time of the comparator is 0 and the current source is turned off as soon as the virtual ground voltage $V_X$ becomes 0. However, since the delay time of an actual comparator is finite, the feedback capacitor $C_F$ and load capacitor $C_L$ are unnecessarily charged during the delay time and the output voltage Vout overshoots.

Figure 6:
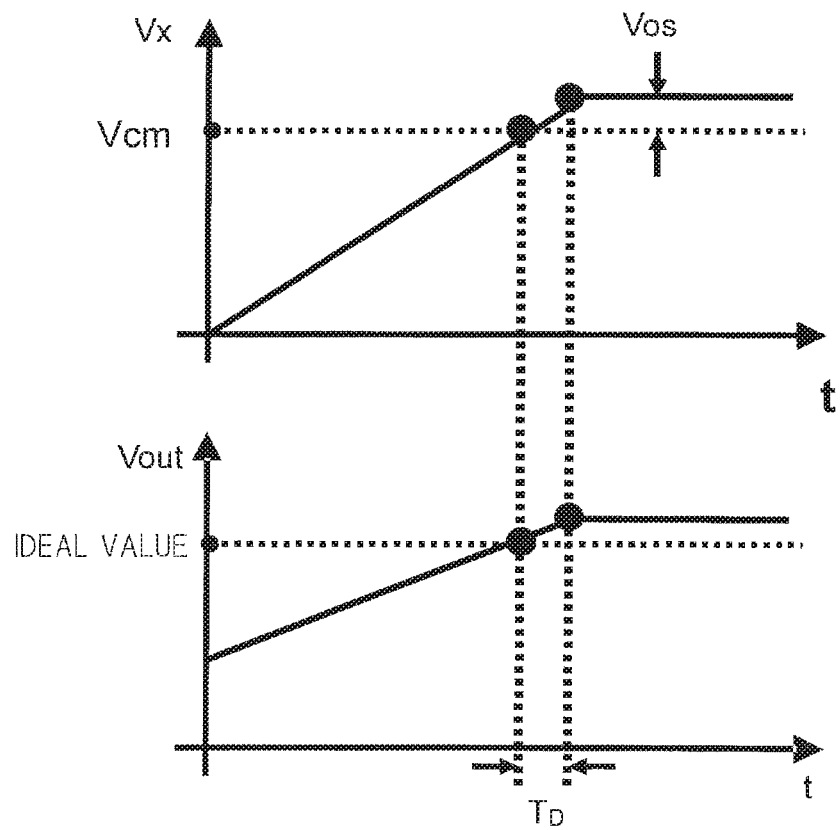
FIG. 6 is a graph showing the output voltage of the amplifier circuit of FIG. 5 in the amplification phase.

FIG. 6 is a diagram showing the virtual ground voltage $V_X$ and output voltage Vout of the amplifier circuit of FIG. 5 in the amplification phase. As shown in FIG. 6, in this amplifier circuit, an overshoot voltage $V_{OS}$ occurs depending on delay time $T_D$. Here, when the delay time of the comparator is defined as $T_D$, the overshoot voltage $V_{OS}$ can be expressed by the following formula.

$$V_{OS} = \frac{T_D I_D}{C_{sum}} \quad (3)$$

In Formula (3), $I_D$ represents a current value supplied by the current source, and $C_{sum}$ represents a capacitance value ($C_F \times C_L/(C_F+C_L)$) of the capacitors connected in series. Since the virtual ground voltage $V_X$ is a voltage obtained by dividing the output voltage Vout by the feedback capacitor $C_F$ and load capacitor $C_L$, the error occurring in the output voltage Vout is proportional to the overshoot voltage $V_{OS}$. Therefore, the error of the output voltage Vout can be made small by making the overshoot voltage $V_{OS}$ small.

As will be understood from Formula (3), the overshoot voltage $V_{OS}$ can be made small by making the current value $I_D$ small, making the delay time $T_D$ short, or making the capacitance value $C_Sum$ large. However, making the current value $I_D$ small leads to a problem of lengthening the time for charging the feedback capacitor $C_F$ and load capacitor $C_L$, which lengthens the time taken in the amplification phase. Further, making the delay time $T_D$ short and making the capacitance value $C_Sum$ large lead to a problem of increasing the power consumption of the amplifier circuit.

Accordingly, as a method to make the error of the output voltage Vout small without changing $I_D$, $T_D$, and $C_Sum$, it has been proposed to extract the charge corresponding to the delay time $T_D$ from the feedback capacitor $C_F$ and load capacitor $C_L$. This is made possible by supplying current having a current value $-I_D$ to the feedback capacitor $C_F$ and load capacitor $C_L$ during the delay time $T_D$.

When the delay time $T_D$ and current value $-I_D$ are reproduced with high accuracy, the above method makes it possible to make the error of the output voltage Vout small and improve amplification accuracy. However, it is generally difficult to reproduce the delay time $T_D$ and current value $-I_D$ with high accuracy.

Further, a method to predict the amount of charge to be extracted from the feedback capacitor $C_F$ and load capacitor $C_L$ has been proposed. However, it is difficult to predict a change in the error depending on environment variation (e.g., a change in the delay time $T_D$ depending on a temperature change).

Hereinafter, embodiments of the present disclosure will be explained referring to the drawings.

First Embodiment

An amplifier circuit according to a first embodiment will be explained referring to FIGS. 7 to 15. The amplifier circuit according to the present embodiment is inputted with an input voltage Vin from an input terminal Tin, and amplifies the input voltage Vin by a predetermined amplification factor, and outputs it from an output terminal Tout as an output voltage Vout. The amplifier circuit has two operation phases including a sampling phase for sampling the input voltage Vin and an amplification phase for amplifying the sampled input voltage Vin.

Figure 7:
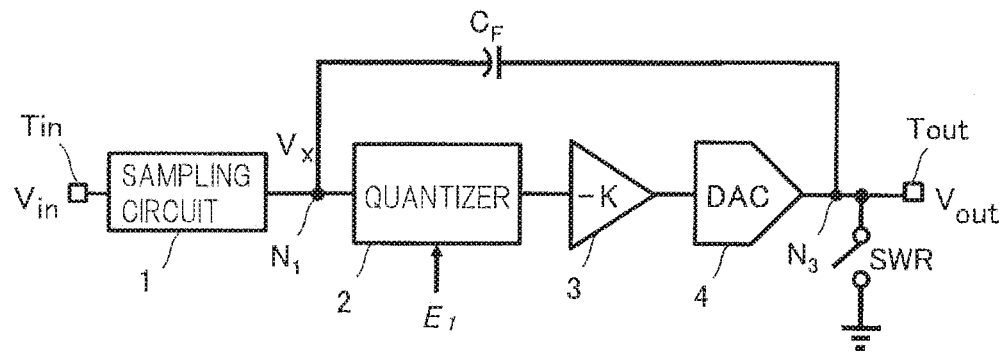
FIG. 7 is a diagram showing an example of an amplifier circuit according to a first embodiment.

FIG. 7 is a diagram showing an example of an amplifier circuit according to the present embodiment. As shown in FIG. 7, this amplifier circuit has the input terminal Tin, the output terminal Tout, a sampling circuit 1, a quantizer 2, a digital calculation circuit 3, a DA converter (DAC) 4, a feedback capacitor $C_F$, and a reset switch SWR.

The sampling circuit 1 has an input terminal connected to the input terminal Tin of the amplifier circuit and an output terminal connected to a node N1. The node $N_1$ is a connecting path of the quantizer 2 and feedback capacitor $C_F$. That is, the sampling circuit 1 is connected between the input terminal Tin and quantizer 2. The sampling circuit 1 is inputted with the input voltage Vin and outputs an output voltage $V_X$.

Figure 8:
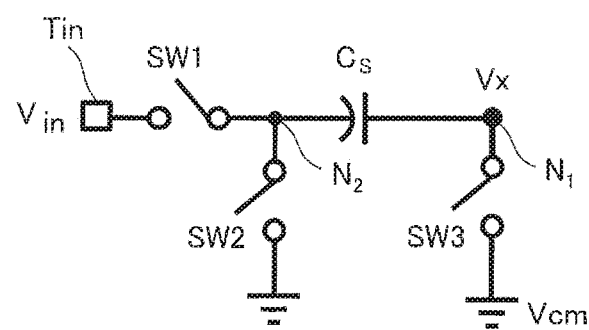
FIG. 8 is a diagram showing an example of the sampling circuit of FIG. 7.

FIG. 8 is a diagram showing an example of the sampling circuit 1. The sampling circuit 1 of FIG. 8 is a switched capacitor circuit having switches SW1 to SW3 and a sampling capacitor $C_S$.

One end of the switch SW1 is connected to the input terminal Tin and the other end thereof is connected to a node $N_2$. The node $N_2$ is a connecting path of the switches SW1 and SW2 and sampling capacitor $C_S$. One end of the switch SW1 is the input terminal of the sampling circuit 1.

One end of the switch SW2 is connected to the node $N_2$ and the other end thereof is grounded. The ground voltage is defined as Vcm (=0).

One end of the switch SW3 is connected to the node $N_1$ and the other end thereof is grounded. One end of the sampling capacitor $C_S$ is connected to the node $N_2$ and the other end thereof is connected to the node $N_1$. The connecting path of the switch SW3 and sampling capacitor $C_S$ is connected to the output terminal of the sampling circuit 1.

In the sampling circuit 1 of FIG. 8, in the sampling phase, the switches SW1 and SW3 are turned on and the switch SW2 is turned off, by which sampled input voltage Vin is stored in the sampling capacitor $C_S$. At this time, the output voltage $V_X$ is 0.

Further, in the sampling circuit 1 of FIG. 8, in the amplification phase, the switches SW1 and SW3 are turned off and the switch SW2 is turned on, by which the output voltage $V_X$ becomes $-Vin$.

Note that the configuration of the sampling circuit 1 should not be limited to FIG. 8. For example, the sampling circuit 1 may be formed using a plurality of switched capacitor circuits of FIG. 8 connected in parallel. Further, the sampling circuit 1 may perform a flip-around type sampling further using the feedback capacitor $C_F$.

The quantizer 2 is connected between the sampling circuit 1 and digital calculation circuit 3. The quantizer 2 is inputted with the output voltage $V_X$ of the sampling circuit 1 and quantizes the inputted output voltage $V_X$ to N bits. The quantizer 2 outputs a digital code D as a result of the quantization. The digital code D is an N-bit digital value depending on the level of the output voltage $V_X$. When the quantization error of the quantizer 2 is defined as $E_1$, $D=V_X+E_1(V_X)$. The quantizer 2 is formed using a comparator, an ADC, etc. The quantization error $E_1$ can be expressed as a function of $V_X$, and can be made approximate to a uniform distribution function when N is sufficiently large.

Figure 9:
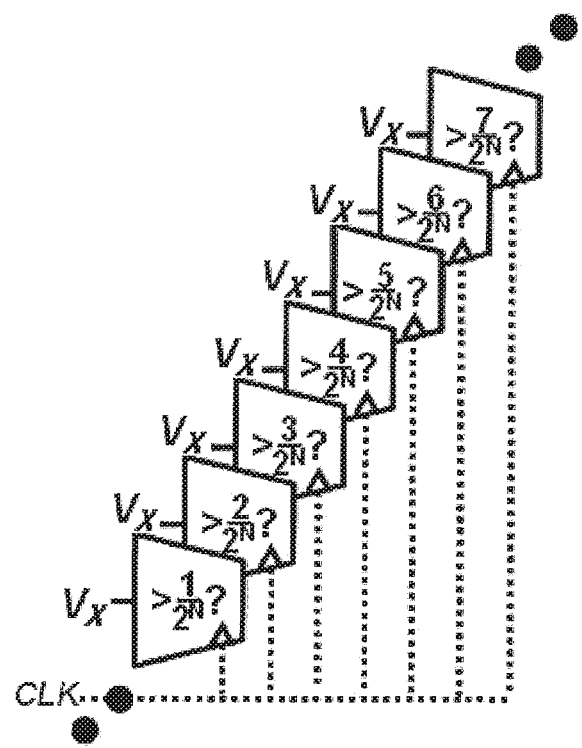
FIG. 9 is a diagram showing an example of a quantizer of FIG. 7.

FIG. 9 is a diagram showing an example of the quantizer 2. The quantizer 2 of FIG. 9 is an N-bit flash type ADC formed using $2_N$ comparators connected in parallel. Each comparator is inputted with the output voltage $V_X$ and a reference voltage corresponding to the bit number thereof, and outputs 0 or 1 depending on a comparison result. When N is sufficiently large, the quantization error $E_1$ of the quantizer 2 of FIG. 9 is uniformly distributed from $+V_{LSB}$ to $-V_{LSB}$. At this time, $V_{LSB}$ can be expressed by the following formula.

$$V_{LSB} = \frac{V_{range}}{2^{N+1}} \quad (4)$$

In Formula (4), Vrange represents an input range of the quantizer 2. When a flash type ADC is used as the quantizer 2, the amplification phase of the amplifier circuit can be shortened and the speed of the amplifier circuit can be increased.

Note that the quantizer 2 should not be limited to the flash type ADC, and may be a pipeline ADC, a successive approximation ADC, or a delta-sigma ADC.

The digital calculation circuit 3 is connected between the quantizer 2 and DAC 4. The digital calculation circuit 3 is inputted with the digital code D outputted from the quantizer 3, multiplies the inputted digital code D by $-K$, and outputs it. That is, the digital calculation circuit 3 outputs a digital code of $(-K\times D)$. A coefficient K is set depending on a capacitance value $C_S$ of the sampling capacitors $C_S$ and a capacitance value $C_F$ of the feedback capacitor $C_F$. How to set the coefficient K will be mentioned later.

The DAC 4 has an input terminal connected to the output terminal of the digital calculation circuit 3 and an output terminal connected to a node $N_3$. The node $N_3$ is a connecting path of the output terminal Tout of the amplifier circuit and the feedback capacitor $C_F$. That is, the DAC 4 is connected between the digital calculation circuit 3 and output terminal Tout. The DAC 4 is inputted with the digital code (−K×D) outputted from the digital calculation circuit 3, performs DA conversion on the inputted digital code, and outputs an analog signal.

Figure 10:
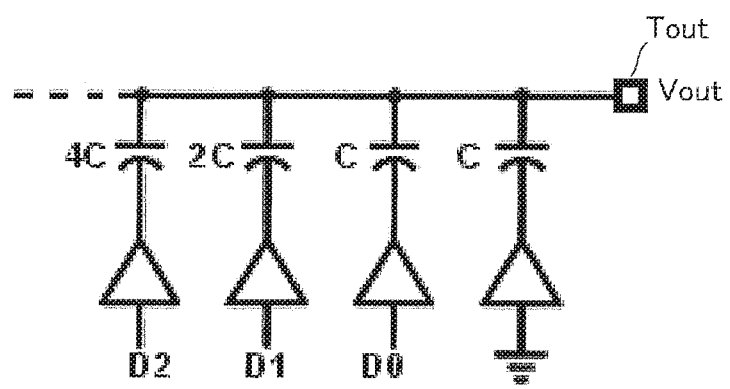
FIG. 10 is a diagram showing an example of a DA converter of FIG. 7.

FIG. 10 is a diagram showing an example of the DAC 4. The DAC 4 of FIG. 10 is an N-bit capacitor DAC (DCC: Digital-Charge Converter) which outputs a charge depending on an inputted digital code. As shown in FIG. 10, this DAC 4 has N buffers connected in parallel to be inputted with respective bits (D0, D1, . . . ) of the digital code, and N capacitor elements (C, 2C, . . . ) each of which is connected to each buffer in series. A charge $Q_{INJ}$ outputted from the DAC 4 of FIG. 10 can be expressed by the following formula.

$$Q_{INJ} = \sum_{n=0}^{N} 2^n C \times D_n \times Vref \quad (5)$$

In Formula (5), C represents a capacitance value of the capacitor element corresponding to the minimum bit, Dn represents an n-th bit value (0 or 1) of the digital code D, and Vref represents a driving voltage of the buffer. The charge $Q_{INJ}$ outputted from the DAC 4 of FIG. 10 is stored in the feedback capacitor $C_F$, by which Vout=$Q_{INJ}/C_F$.

Note that when the capacitor DAC of FIG. 10 is used as the DAC 4, the DAC 4 can output both of positive charge and negative charge, by using a three state buffer as the buffer or by outputting an intermediate code (e.g., 100 . . . or 011 . . . ) in the sampling phase.

Figure 11:
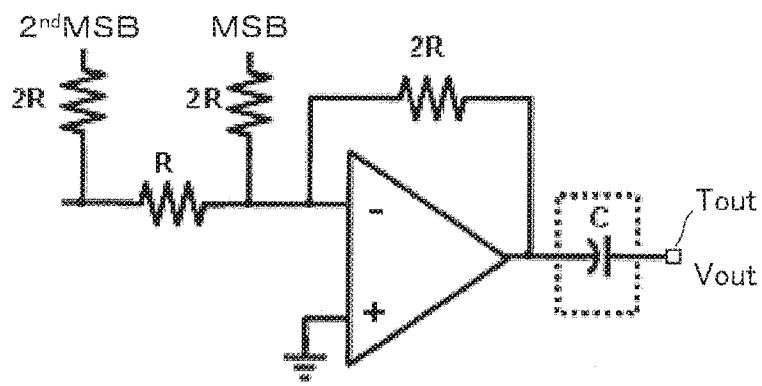
FIG. 11 is a diagram showing another example of the DA converter of FIG. 7.

Further, the DAC 4 should not be limited to the capacitor DAC, and may be an R-2R resistance DAC or a ladder DAC. Note that when the R-2R resistance DAC or ladder DAC is used as the DAC 4, it is desirable to connect a capacitor element between the DAC 4 and output terminal Tout as shown in FIG. 11 in order to convert output impedance into high impedance.

The feedback capacitor $C_F$ is connected between the output terminal (node $N_1$) of the sampling circuit 1 and the output terminal Tout. The feedback capacitor $C_F$ is used to form a feedback circuit connecting the input terminal of the quantizer 2 and the output terminal Tout. In the amplification phase, the feedback capacitor $C_F$ feeds the analog signal outputted from the DAC 4 back to the output voltage $V_X$ of the sampling circuit 1.

One end of the reset switch SWR is connected to the output terminal Tout and the other end thereof is grounded. The reset switch SWR is turned on in the sampling phase and turned off in the amplification phase. When the reset switch SWR is turned on, the charge stored in the feedback capacitor $C_F$ is reset.

Figure 12:
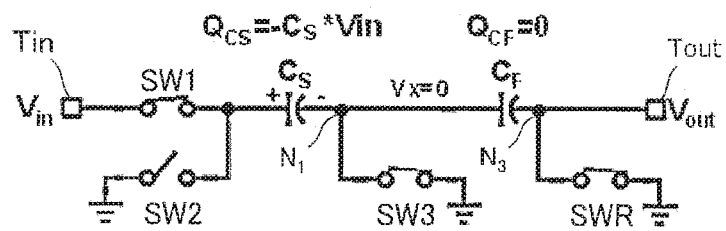
FIG. 12 is a diagram showing an example of the amplifier circuit of FIG. 7 in a sampling phase.
Figure 13:
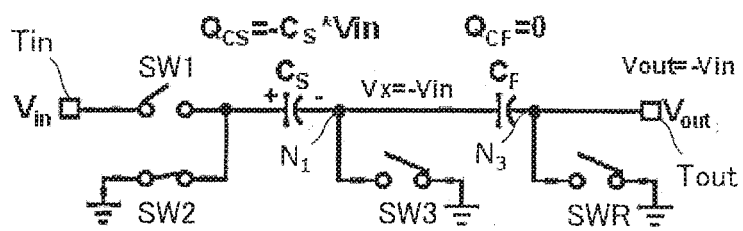
FIG. 13 is a diagram showing an example of the amplifier circuit of FIG. 7 in the amplification phase.
Figure 14:
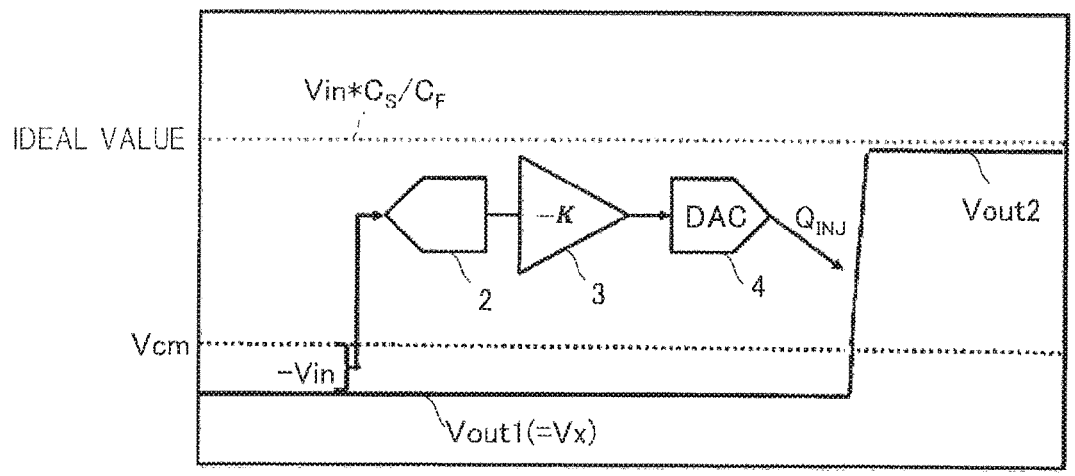
FIG. 14 is a graph showing the output voltage of the amplifier circuit of FIG. 7 in the amplification phase.

Hereinafter, the operation of the amplifier circuit according to the present embodiment will be explained referring to FIGS. 12 to 15. FIG. 12 is a diagram showing the amplifier circuit in the sampling phase. FIG. 13 is a diagram showing the amplifier circuit in the amplification phase. In FIG. 12 and FIG. 13, the quantizer 2, digital calculation circuit 3, and DAC 4 are omitted. Further, FIG. 14 is a diagram showing the output voltage Vout in the amplification phase. Hereinafter, it is premised that the amplifier circuit has the sampling circuit 1 of FIG. 8 and the DAC 4 of FIG. 10.

In the sampling phase, as shown in FIG. 12, the switches SW1 and SW3 and reset switch SWR are turned on and the switch SW2 is turned off, by which the input voltage Vin is sampled and a charge $Q_{cs}$ depending on the input voltage Vin is stored in the sampling capacitor C. The charge $Q_{cs}$ can be expressed by the following formula.

$$Q_{CS}=C_S V_{in} \quad (6)$$

At this time, since the switch SW3 is turned on, the output voltage $V_X$ is 0 ($V_X$=0). Further, since the reset switch SWR is turned on, the feedback capacitor $C_F$ short-circuits, and a charge $Q_{CF}$ becomes 0 ($Q_{CF}$=0).

In the amplification phase, as shown in FIG. 13, the switches SW1 and SW3 and reset switch SWR are turned off and the switch SW2 is turned on. Immediately after the amplification phase starts, the charge $Q_{CS}$ expressed by Formula (6) is stored in the sampling capacitor $C_S$. Therefore, based on the law of conservation of charge, the output voltage $V_X$ can be expressed by the following formula.

$$V_x = \frac{Q_{CS}}{C_S} = -V_{in} \quad (7)$$

At this time, since the output terminal Tout is an open end, an output voltage Vout 1 becomes equal to the output voltage $V_X$.

$$V_{out1}=V_X \quad (8)$$

The quantizer 2 quantizes the output voltage $V_X$ expressed by Formula (7), and outputs the digital code D. Since D=$V_X$−$E_1$, the digital code D can be expressed by the following formula.

$$D=-(V_{in}+E_1) \quad (9)$$

Upon being inputted with the digital code D expressed by Formula (9), the digital calculation circuit 3 multiplies the digital code D by −K and outputs it. That is, the digital calculation circuit 3 outputs a digital code of (−K×D). Here, the coefficient K is a coefficient showing a transition amount of Vout to make the output voltage $V_X$ approach 0. The coefficient K can be expressed by the following formulas.

$$K_1 = \frac{C_F + C_S}{C_F} \quad (10)$$

$$K=K_1 C_{out} \quad (11)$$

$K_1$ in Formula (10) is a feedback coefficient determined by the capacitance values $C_S$ and $C_F$. This feedback coefficient $K_1$ can be easily designed by the capacitance values $C_S$ and $C_F$. The feedback coefficient $K_1$ is a fixed value since it is generally designed to be invariant under environment variation.

Further, the coefficient K in Formula (11) is a coefficient obtained by correcting the feedback coefficient $K_1$ in Formula (10) by a capacitance value Cout of the amplifier circuit seen from the output terminal Tout. The capacitance value Cout, which is a capacitance value of the capacitors connected in series, can be expressed as $C_S \times C_F/(C_S+C_F)$. The correction of Formula (11) is necessary since the charge $Q_{INJ}$ outputted from the DAC 4 is redivided between the sampling capacitor $C_S$ and feedback capacitor $C_F$.

The DAC 4 outputs the charge $Q_{INJ}$ depending on the digital code inputted by the digital calculation circuit 3. The charge $Q_{INJ}$ can be expressed by the following formula.

$$Q_{INJ} = K \times (Vin + E_1) \tag{12}$$

The charge $Q_{INJ}$ outputted from the DAC 4 is stored in the feedback capacitor $C_F$, and redivided between the sampling capacitor $C_S$ and feedback capacitor $C_F$. As a result, the output voltage Vout 2 after the storage can be expressed by the following formula.

$$V_{out2} = V_{out1} + \frac{Q_{INJ}}{C_{out}} = V_{in}\frac{C_S}{C_F} + + E_1\left(1 + \frac{C_S}{C_F}\right) \tag{13}$$

As will be understood from Formula (13), the output voltage Vout after amplification is a voltage obtained by amplifying the input voltage Vin by $C_S/C_F$ and adding a quantization error of $(E_1 \times (1 + C_S/C_F))$ thereto. Therefore, in the amplification phase, as shown in FIG. 14, the output voltage Vout shifts from Vout 1 to Vout 2. As a result, the input voltage Vin is amplified to the output voltage Vout expressed by Formula (13). The amplification factor of the amplifier circuit can be expressed as $C_S/C_F$. Further, at this time, the output voltage $V_X$ can be expressed by the following formula, based on the division of capacitance voltage.

$$Vx = \left(1 + \frac{C_S}{C_F}\right)E_1 \times \frac{C_F}{C_S + C_F} = E_1 \tag{14}$$

As explained above, the amplifier circuit according to the present embodiment quantizes the output voltage $V_X$ and stores the charge $Q_{INJ}$ depending on the obtained digital code in the feedback capacitor $C_F$ to make the output voltage $V_X$ approach 0, by which the output voltage Vout approaches the ideal value (voltage obtained by amplifying the input voltage Vin by a predetermined amplification factor).

According to the present embodiment, as will be understood from Formula (13), increasing the quantization accuracy of the quantizer 2 (making the quantization error $E_1$ small) makes it possible to improve amplification accuracy. That is, the amplification accuracy of the amplifier circuit according to the present embodiment does not depend on the performance of the operational amplifier and comparator, differently from the conventional amplifier circuit. Therefore, there is no need to consume high power to improve the performance of the operational amplifier and comparator, which leads to the reduction in the power consumption of the amplifier circuit.

Further, the amplifier circuit according to the present embodiment quantizes the output voltage $V_X$ each time the amplification phase comes, which makes it possible to perform amplification without being influenced by environment variation. Therefore, amplification accuracy of the amplifier circuit according to the present embodiment can be improved compared to the conventional amplifier circuit whose amplification accuracy changes depending on environment variation.

Note that the amplifier circuit in the above explanation is a single-phase circuit, but it may be a differential circuit. Further, the above explanation is given on an ideal case where there is no load capacitance (parasitic capacitance) in the amplifier circuit, but the amplifier circuit may have finite load capacitance.

Figure 15:
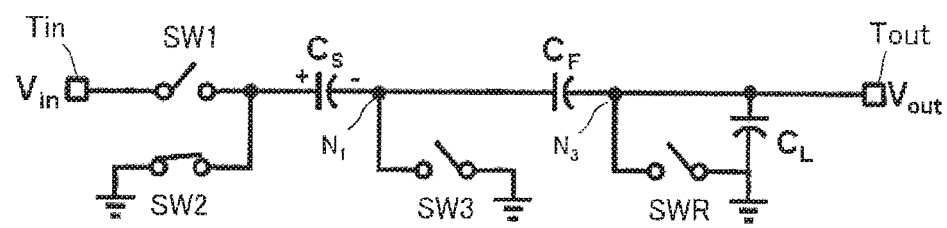
FIG. 15 is a diagram showing another example of the amplifier circuit of FIG. 7 in the amplification phase.

Explanation will be given on a case where the amplifier circuit has the load capacitor $C_L$ shown in FIG. 15. In FIG. 15, the load capacitor $C_L$ is connected between the output terminal Tout and a ground line. The capacitance value of the load capacitor $C_L$ is defined as $C_L$.

In the amplifier circuit according to the present embodiment, in the amplification phase, the charge $Q_{CS}$ stored in the sampling capacitor $C_S$ is distributed to a capacitance $CV_X$ seen from the node $N_1$. When the load capacitor $C_L$ is not provided, $CV_X = C_S$. However, when the load capacitor $C_L$ is provided as shown in FIG. 15, $CV_X$ can be expressed by the following formula.

$$C_{Vx} = C_S + \frac{C_F C_L}{C_F + C_L} \tag{15}$$

Therefore, in the amplifier circuit of FIG. 15, the output voltage $V_X$ at the start of the amplification phase can be expressed by the following formula.

$$Vx = \frac{Q_{CS}}{C_{Vx}} \tag{16}$$

As will be understood from Formula (7) and Formula (16), the voltage value of the output voltage $V_X$ changes depending on whether or not the load capacitor $C_L$ is provided. Similarly, the capacitance value Cout seen from the output terminal Tout, which can be expressed as $Cout = C_S \times C_F (C_S + C_F) + C_L$, changes depending on whether or not the load capacitor $C_L$ is provided.

As stated above, the output voltage $V_X$ and capacitance value Cout change depending on the load capacitor $C_L$ included in the amplifier circuit. Thus, it is desirable for the amplifier circuit to calibrate the coefficient K through a calibration process.

Second Embodiment

An amplifier circuit according to a second embodiment will be explained referring to FIGS. 16 to 19. The amplifier circuit according to the present embodiment realizes amplifying operation by a successive approximation ADC (SAR-ADC).

Figure 16:
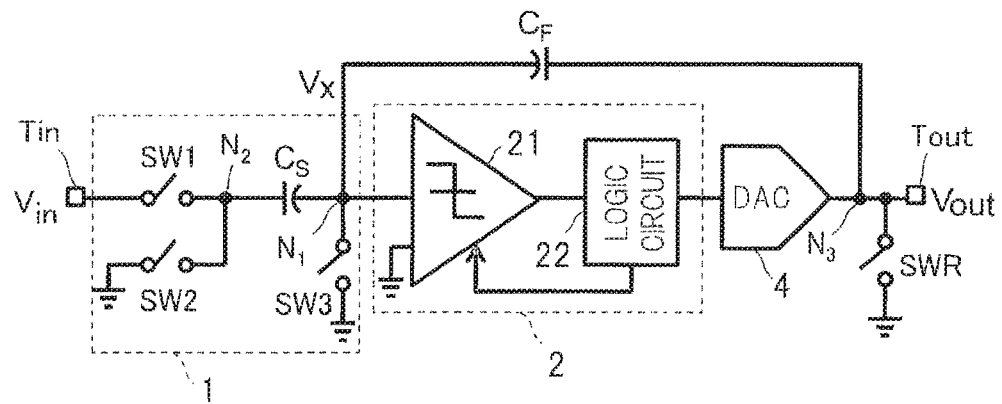
FIG. 16 is a diagram showing an example of an amplifier circuit according to a second embodiment.

FIG. 16 is a diagram showing an example of an amplifier circuit according to the present embodiment. As shown in FIG. 16, this amplifier circuit has the sampling circuit 1, quantizer 2, DAC 4, feedback capacitor $C_F$, and reset switch SWR, but does not have the digital calculation circuit 3 differently from the amplifier circuit according to the first embodiment. In FIG. 16, the sampling circuit 1 is the switched capacitor circuit of FIG. 8, but should not be limited thereto.

In the present embodiment, the quantizer 2 is an SAR-ADC. In the amplification phase, the quantizer 2 carries out a plurality of cycles of 1-bit basis quantization to generate the digital code D. As shown in FIG. 16, the quantizer 2 has a comparator 21 and the logic circuit 22.

One input terminal of the comparator 21 (first comparator) is connected to the output terminal (node $N_1$) of the sampling circuit 1 and inputted with the output voltage $V_X$. Further, the other input terminal of the comparator 21 is grounded and inputted with the ground voltage Vcm (=0). The comparator 21 compares $V_X$ with 0 and outputs a digital value (0 or 1) depending on the comparison result. The comparator 21 operates as a 1-bit quantizer.

The logic circuit 22 is a control circuit for controlling the comparator 21. In the amplification phase, the logic circuit 22 instructs the comparator 21 to carry out a plurality of cycles of comparison of $V_X$ with 0, generates the digital code D using the digital value obtained in each cycle, and inputs it into the DAC 4. That is, the logic circuit 22 controls the comparator 21 to realize the successive approximation operation of the SAR-ADC.

Next, the operation of the amplifier circuit according to the present embodiment will be explained referring to FIGS. 17 to 19. Hereinafter, the DAC 4 is defined as a capacitor DAC, but should not be limited thereto as mentioned above.

In the sampling phase, the amplifier circuit according to the present embodiment operates similarly to the first embodiment. That is, the switches SW1 and SW3 and reset switch SWR are turned on and the switch SW2 is turned off, by which sampled input voltage Vin is stored in the sampling capacitor $C_S$ as the charge $Q_{CS}$.

In the amplification phase, the switches SW1 and SW3 and reset switch SWR are turned off and the switch SW2 is turned on, by which the output voltage $V_X$ has a constant value depending on the input voltage Vin. Further, the logic circuit 22 starts and carries out N cycles of successive approximation operation.

Figure 17:
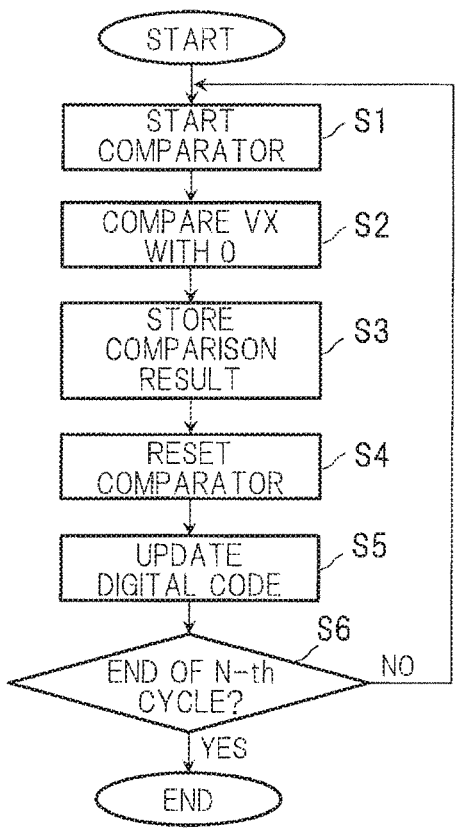
FIG. 17 is a flow chart showing the operation of the amplifier circuit of FIG. 16 in the amplification phase.

Here, FIG. 17 is a flow chart showing the operation of the quantizer 2 in the amplification phase. First, upon the start of the amplification phase, the logic circuit 22 starts, and the logic circuit 22 starts the comparator 21 (Step S1).

Next, the comparator 21 having started compares $V_X$ with 0 and outputs a digital value depending on the comparison result (Step S2). Hereinafter, it is premised that the comparator 21 outputs 1 when $V_X$ is larger than 0, and outputs 0 when $V_X$ is smaller than 0.

The comparison result (digital value) outputted from the comparator 21 is stored in the logic circuit 22 (Step S3).

The logic circuit 22 stores the comparison result and then resets the comparator 21 (Step S4). That is, the logic circuit 22 stops the comparison performed by the comparator 21, and restores the comparator to the state before the comparator 21 started.

Then, based on the stored comparison result, the logic circuit 22 updates the digital code D to be inputted into the DAC 4 (Step S5). The logic circuit 22 updates the digital code D so that $V_X$ approaches 0. Concretely, the logic circuit 22 updates the digital code D to make it smaller when being inputted with 1 as the comparison result, and updates the digital code D to make it larger when being inputted with 0 as the comparison result.

After that, the logic circuit 22 judges whether N cycles of successive approximation operation has been completed or not (Step S6). When N cycles of successive approximation operation has been completed (YES at Step S6), the amplification phase terminates, and the sampling phase starts again. On the other hand, when N cycles of successive approximation operation has not been completed (NO at Step S6), the logic circuit 22 starts the next cycle of successive approximation operation and starts the comparator 21 again (Step S1).

Figure 18:
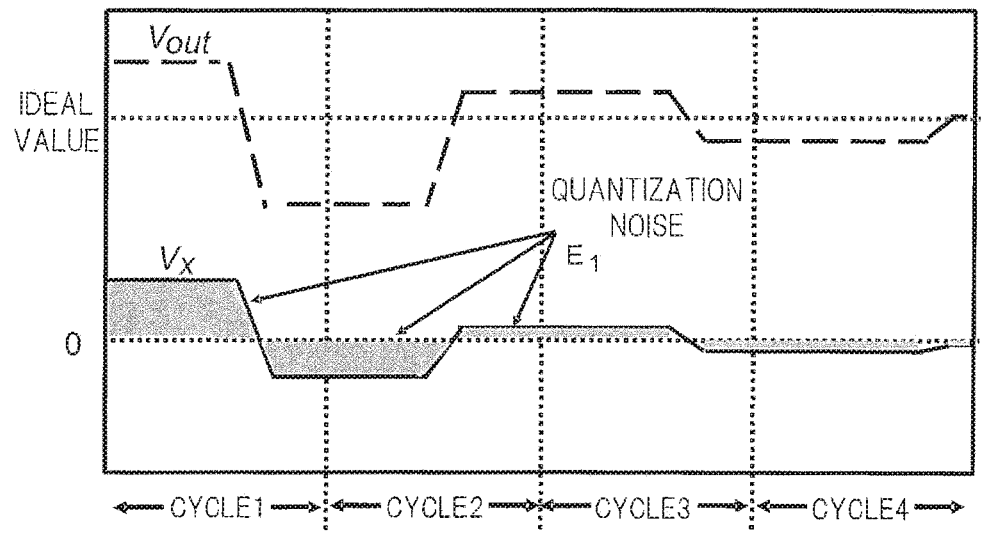
FIG. 18 is a graph showing the output voltage of the amplifier circuit of FIG. 16 in the amplification phase.
Figure 19:
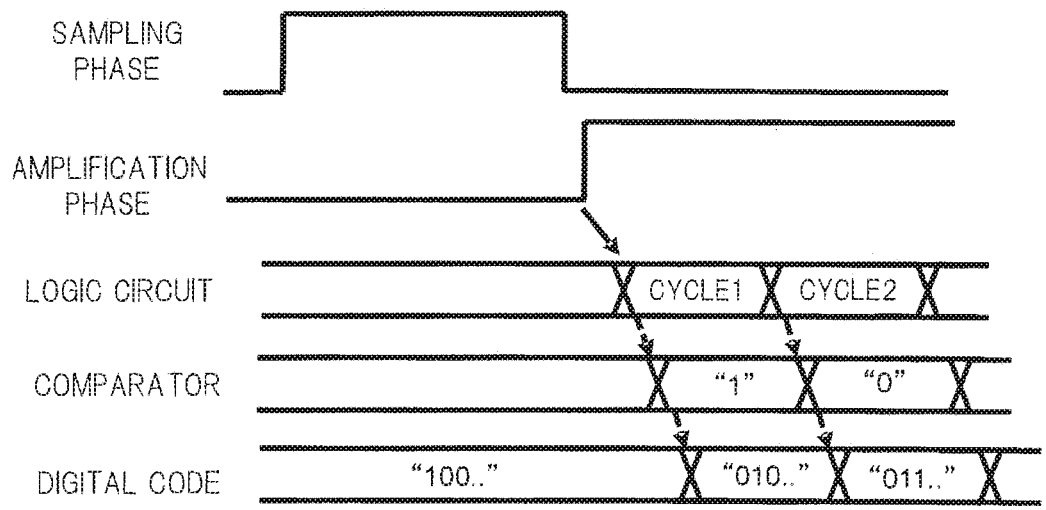
FIG. 19 is a timing chart showing the operation of the amplifier circuit of FIG. 16.

For example, when the output voltage $V_X$ is larger than 0 at the start of the amplification phase as shown in FIG. 18, the comparator 21 outputs 1 in Cycle 1 (successive approximation operation in the 1st cycle) as shown in FIG. 19. Then, the logic circuit 22 inputted with 1 updates the digital code D to make it smaller.

As shown in FIG. 19, when the digital code D (reset value) at the start of the amplification phase is 100 . . . , the logic circuit 22 changes the 1st bit (MSB) to 0 and changes the 2nd bit to 1, by which the digital code D is updated from 100 . . . to 010 . . . .

After the digital code D is updated, the DAC 4 outputs charge depending on the updated digital code D. When the digital code D is updated to be made smaller, the DAC 4 outputs charge to make the output voltage Vout smaller. That is, the DAC 4 extracts charge from the feedback capacitor $C_F$.

As a result, as shown in FIG. 18, the output voltage Vout becomes smaller, and the output voltage $V_X$ becomes smaller correspondingly. After that, the comparator 21 is reset, and Cycle 1 terminates.

After Cycle 1 terminates, Cycle 2 (successive approximation operation in the 2nd cycle) starts. As shown in FIG. 18, since $V_X$ became smaller than 0 in Cycle 1, the comparator 21 outputs 0 in Cycle 2. Then, the logic circuit 22 inputted with 0 updates the digital code D to make it larger.

Since the digital code D became 010 . . . in Cycle 1, the logic circuit 22 changes the 3rd bit to 1, by which the digital code D is updated from 010 . . . to 011 . . . .

After the digital code D is updated, the DAC 4 outputs charge depending on the updated digital code D. When the digital code D is updated to be made larger, the DAC 4 outputs charge to make the output voltage Vout larger. That is, the DAC 4 stores the charge in the feedback capacitor $C_F$.

As a result, as shown in FIG. 18, the output voltage Vout becomes larger, and the output voltage $V_X$ becomes larger correspondingly. After that, the comparator 21 is reset, and Cycle 2 terminates.

Then, a similar cycle is repeated until the N-th cycle terminates. As shown in FIG. 18, each time the successive approximation operation is repeated, the output voltage $V_X$ approaches 0 and the quantization error $E_1$ becomes smaller. Correspondingly, the output voltage Vout approaches the ideal value, and the amplification accuracy of the amplifier circuit is improved.

As explained above, the amplifier circuit according to the present embodiment quantizes the output voltage $V_X$ by the SAR-ADC and stores the charge depending on the obtained digital code in the feedback capacitor $C_F$ to make the output voltage $V_X$ approach 0, by which the output voltage Vout approaches the ideal value (voltage obtained by amplifying the input voltage Vin by a predetermined amplification factor).

The amplifier circuit according to the first embodiment requires a high-accuracy quantizer 2 in order to improve amplification accuracy. Further, it requires a calibration process for calibrating the coefficient K in order to support the load capacitor $C_L$ etc. included in the amplifier circuit.

On the other hand, in the amplifier circuit according to the present embodiment, the quantizer 2 can be formed using the comparator 21, which makes it possible to simplify the configuration of the quantizer 2. Further, in the present embodiment, when the DAC 4 is monotonic, $V_X$ automatically approaches 0, which eliminates the need to perform the calibration process.

In the amplifier circuit according to the present embodiment, the number of cycles N of the successive approximation operation has to be increased to improve amplification accuracy. The more the number of cycles N is increased, the more the time of the amplification phase is lengthened.

However, since the speed of the successive approximation operation has been increased by the miniaturization of CMOS devices in recent years, reduction in the operation speed of the amplifier circuit can be restrained even when the number of cycles N is increased to improve the amplification accuracy.

Note that in the above explanation, the comparator 21 has 1-bit resolution, but it may have a resolution of 2 bits or more. This makes it possible to reduce the number of cycles of the successive approximation operation and increase the speed of the operation of the amplifier circuit.

Further, the operation of the logic circuit 22 (storing the digital value and updating the digital code D) may be carried out in synchronization with a clock, or may be carried out continuously without being synchronous with the clock.

Further, it is possible to carry out a noise shaping process by integrating a residual (output voltage $V_X$) after the successive approximation operation, which makes it possible to further reduce the quantization error $E_1$ and improve amplification accuracy.

Third Embodiment

An integrator according to a third embodiment will be explained referring to FIG. 20. The integrator according to the present embodiment has the amplifier circuit according to the first embodiment.

FIG. 20 is a diagram showing an example of an integrator according to the present embodiment. As shown in FIG. 20, this integrator has switches SW4 and SW5, and does not have the reset switch SWR. The other components are similar to those of the first embodiment.

The switch SW4 (first switch) is connected between the sampling circuit 1 and feedback capacitor $C_F$. The switch SW4 is turned off in the sampling phase and turned on in the amplification phase. In the example of FIG. 20, the switch SW4 is connected between the sampling circuit 1 and node $N_1$, but it may be connected between the node $N_1$ and feedback capacitor $C_F$.

The switch SW5 (second switch) is connected between the DAC 4 and feedback capacitor $C_F$. The switch SW5 is turned off in the sampling phase and turned on in the amplification phase. In the example of FIG. 20, the switch SW5 is connected between the DAC 4 and node $N_3$, but it may be connected between the node $N_3$ and feedback capacitor $C_F$.

In this integrator, in the sampling phase, the switches SW4 and SW5 are turned off and the feedback capacitor $C_F$ enters a floating state, by which the charge accumulated in the feedback capacitor $C_F$ is retained and the integration operation is made possible.

According to the present embodiment, forming the integrator using the amplifier circuit according to the first embodiment makes it possible to reduce the power consumption of the integrator. This integrator can be applied to a delta-sigma ADC, for example.

Fourth Embodiment

An integrator according to a fourth embodiment will be explained referring to FIGS. 21 to 24. The integrator according to the present embodiment has the amplifier circuit according to the second embodiment.

Figure 21:
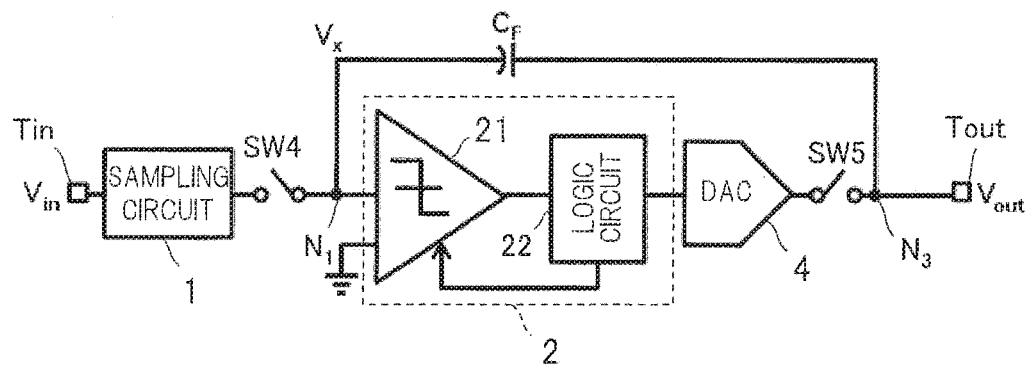
FIG. 21 is a diagram showing an example of an integrator according to a fourth embodiment.

FIG. 21 is a diagram showing an example of an integrator according to the present embodiment. As shown in FIG. 21, this integrator has the switches SW4 and SW5, and does not have the reset switch SWR. The other components are similar to those of the second embodiment.

The switch SW4 is connected between the sampling circuit 1 and feedback capacitor $C_F$. The switch SW4 is turned off in the sampling phase and turned on in the amplification phase. In the example of FIG. 20, the switch SW4 is connected between the sampling circuit 1 and node $N_1$, but it may be connected between the node $N_1$ and feedback capacitor $C_F$.

The switch SW5 is connected between the DAC 4 and feedback capacitor $C_F$. The switch SW5 is turned off in the sampling phase and turned on in the amplification phase. In the example of FIG. 20, the switch SW5 is connected between the DAC 4 and node $N_3$, but it may be connected between the node $N_3$ and feedback capacitor $C_F$.

In this integrator, in the sampling phase, the switches SW4 and SW5 are turned off and the feedback capacitor $C_F$ enters a floating state, by which the charge accumulated in the feedback capacitor $C_F$ is retained and the integration operation is made possible.

According to the present embodiment, forming the integrator using the amplifier circuit according to the second embodiment makes it possible to reduce the power consumption of the integrator. This integrator can be applied to a delta-sigma ADC, for example.

Figure 22:
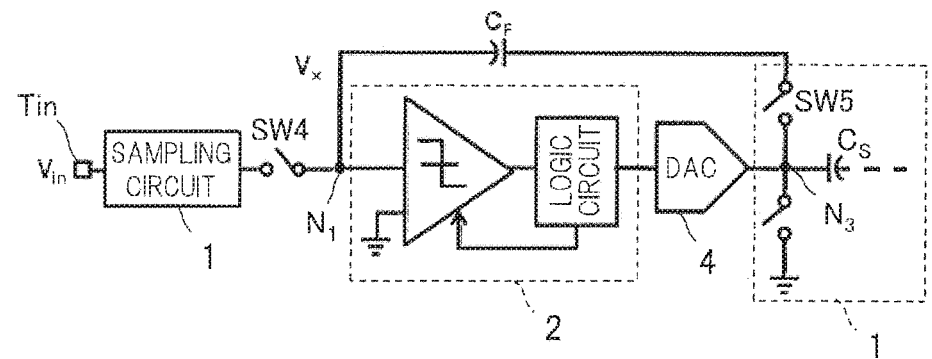
FIG. 22 is a diagram showing a modification example of the integrator of FIG. 21.

Note that when the sampling circuit 1 for the next stage is connected subsequent to the integrator according to the present embodiment, it is desirable to use the switch SW5 also as a switch of the sampling circuit 1 in the subsequent stage, as shown in FIG. 22. Such a configuration makes it possible to reduce the number of switches and to reduce circuit area. This can be similarly applied to when the sampling circuit 1 is connected subsequent to the integrator according to the third embodiment.

Figure 23:
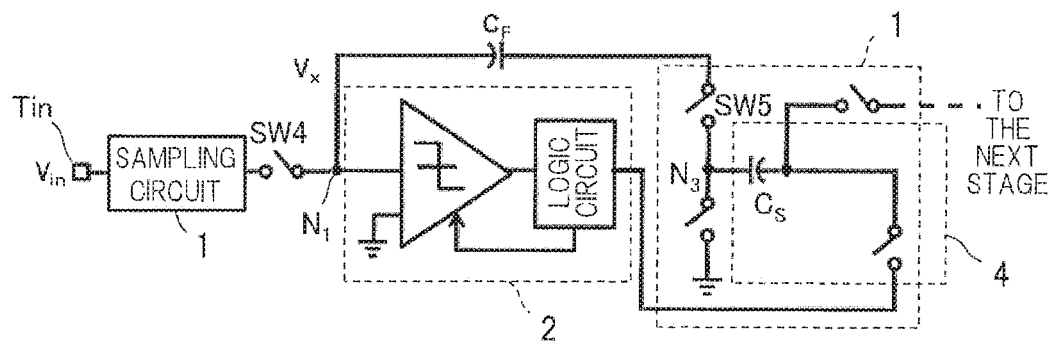
FIG. 23 is a diagram showing a modification example of the integrator of FIG. 21.

Further, when the DAC 4 is a capacitor DAC, the capacitor element of the DAC 4 of FIG. 22 may be used also as the sampling capacitor $C_S$ of the sampling circuit 1 in the subsequent stage. FIG. 23 is a diagram showing an example of an amplifier circuit in which a capacitor element of the DAC 4 is used also as the sampling capacitor $C_S$ in the subsequent stage.

The sampling capacitor $C_S$ connected subsequent to the amplifier circuit of FIG. 23 operates as a sampling capacitor of the sampling circuit 1 in the subsequent stage in the sampling phase, and operates as a capacitor element of the DAC 4 in the amplification phase. Such a configuration makes it possible to reduce the number of capacitor elements and to reduce circuit area. This can be similarly applied to when the sampling circuit 1 is connected subsequent to the integrator according to the third embodiment.

Figure 24:
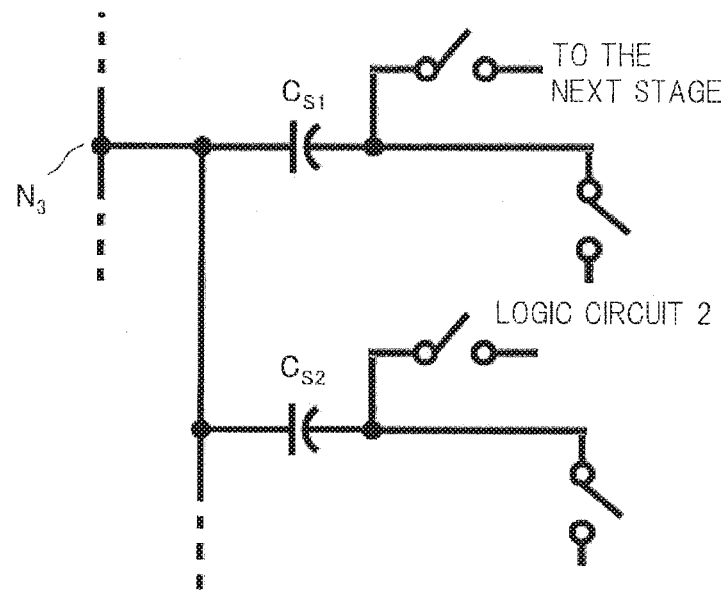
FIG. 24 is an enlarged view of a DAC in the integrator of FIG. 23.

Note that in the example shown in FIG. 23, the DAC 4 has only one capacitor element, but it actually has a plurality of capacitor elements $C_{S1}$, $C_{S2}$, . . . connected in parallel as shown in FIG. 24. The number of capacitor elements to be connected may be determined depending on the accuracy required for the DAC 4.

Fifth Embodiment

Figure 25:
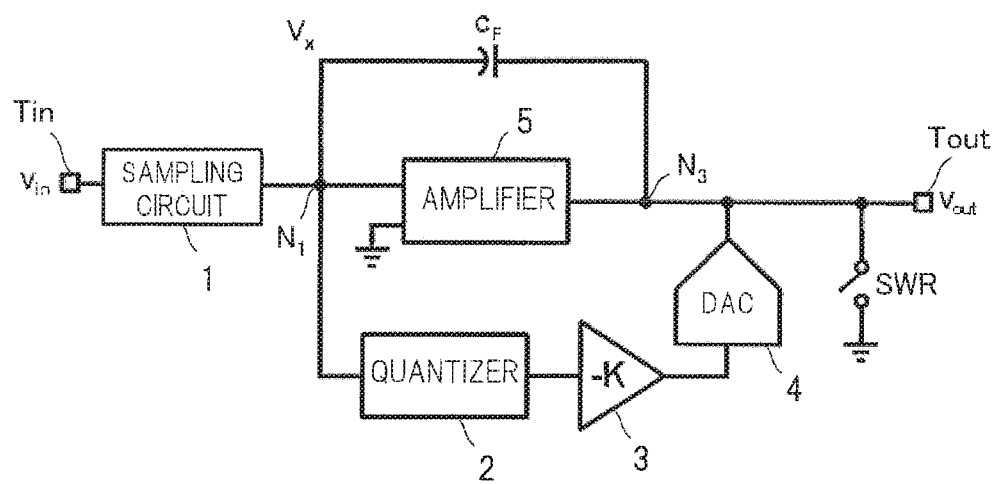
FIG. 25 is a diagram showing an example of an amplifier circuit according to a fifth embodiment.

An amplifier circuit according to a fifth embodiment will be explained referring to FIGS. 25 to 27. FIG. 25 is a diagram showing an example of an amplifier according to the present embodiment. As shown in FIG. 25, this amplifier circuit is obtained by adding an amplifier 5 to the amplifier circuit according to the first embodiment.

One input terminal of the amplifier 5 is connected to the node $N_1$, the other input terminal thereof is grounded, and its output terminal is connected to the node $N_3$. That is, the amplifier 5 is connected between the sampling circuit 1 and output terminal Tout. In the amplification phase, the amplifier 5 amplifies the output voltage $V_X$ of the sampling circuit 1 by a predetermined gain and outputs the amplified voltage.

The operational amplifier or comparator in the conventional amplifier circuit can be used as the amplifier 5. When using an operational amplifier as the amplifier 5, the finite gain of the operational amplifier causes an amplification error. Further, when using a comparator as the amplifier 5, the finite delay time of the comparator causes an amplification error.

Next, the operation of this amplifier circuit will be explained referring to FIG. 26 and FIG. 27. In the sampling phase, this amplifier circuit operates similarly to the first embodiment. Here, FIG. 26 is a flow chart showing the operation of the amplifier circuit according to the present embodiment in the amplification phase.

Figure 26:
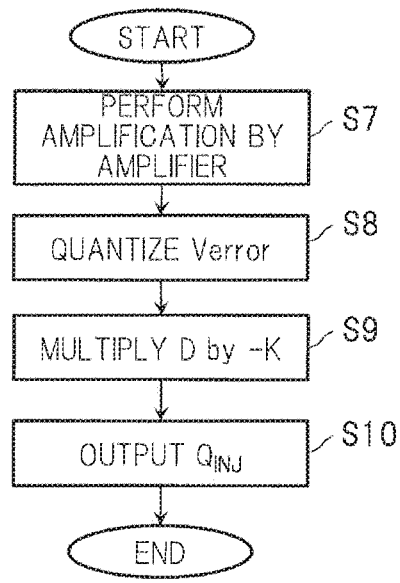
FIG. 26 is a flow chart showing the operation of the amplifier circuit of FIG. 25 in the amplification phase.
Figure 27:
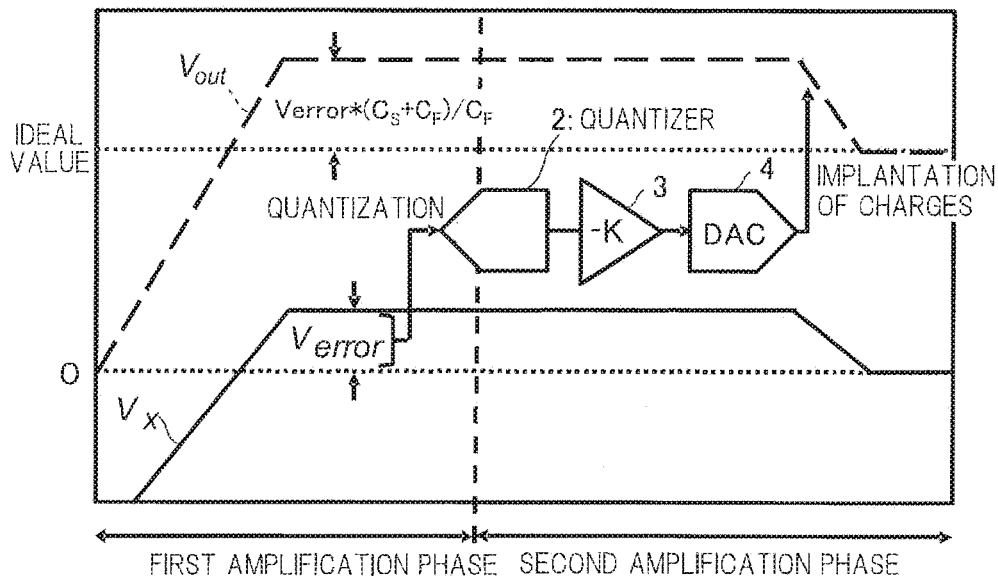
FIG. 27 is a graph showing the output voltage of the amplifier circuit of FIG. 25 in the amplification phase.

As shown in FIG. 26, after the start of the amplification phase, the amplifier 5 of this amplifier circuit carries out amplifying operation first (Step S7). Based on the operation of the amplifier 5, the output voltage $V_X$ of the sampling circuit 1 approaches 0 and the output voltage Vout approaches the ideal value, as shown in FIG. 27. However, the amplification by the amplifier 5 causes an amplification error as stated above. When an amplification error occurring in the output voltage $V_X$ of the sampling circuit 1 is defined as an error voltage Verror, the output voltage Vout has an amplification error of Verror×$(C_S+C_F)/C_F$ with respect to the ideal value.

After a predetermined time has passed since the amplification phase started, the amplifier 5 stops its operation, and the quantizer 2 starts its operation. Hereinafter, when referring to the amplification phase, the period during which the amplifier 5 operates is called a first amplification phase, and the period during which the quantizer 2 operates is called a second amplification phase.

In the second amplification phase, the quantizer 2 quantizes the output voltage $V_X$ at the end of the first amplification phase, which is namely the error voltage Verror (Step S8). Subsequent operation of the amplifier circuit is performed similarly to the first embodiment. That is, the digital calculation circuit 3 multiplies the digital code D outputted from the quantizer 2 by –K (Step S9), and the DAC 4 outputs the charge $Q_{INJ}$ depending on the result of –K×D (Step S10). This makes the output voltage $V_X$ approach 0, and as a result, the output voltage Vout approaches the ideal value and amplification accuracy is improved.

As explained above, in the amplifier circuit according to the present embodiment, rough amplification is performed by the amplifier 5 in the first amplification phase, and then the output voltage $V_X$ of the sampling circuit 1 is made to approach 0 by a method similar to the first embodiment in the second amplification phase. Since a method similar to the first embodiment is used to improve amplification accuracy, an amplifier circuit of low power consumption and high accuracy can be realized.

Further, the input range required for the quantizer 2 can be made considerably narrow compared to the first embodiment, which makes it possible to ease the design of the amplifier circuit.

Further, since only the error voltage Verror has to be cancelled, the level of the analog signal required for the DAC 4 (e.g., the amount of charge to be outputted from DAC 4) can be considerably lowered compared to the first embodiment. Therefore, the amplifier circuit can be designed easily.

Sixth Embodiment

Figure 28:
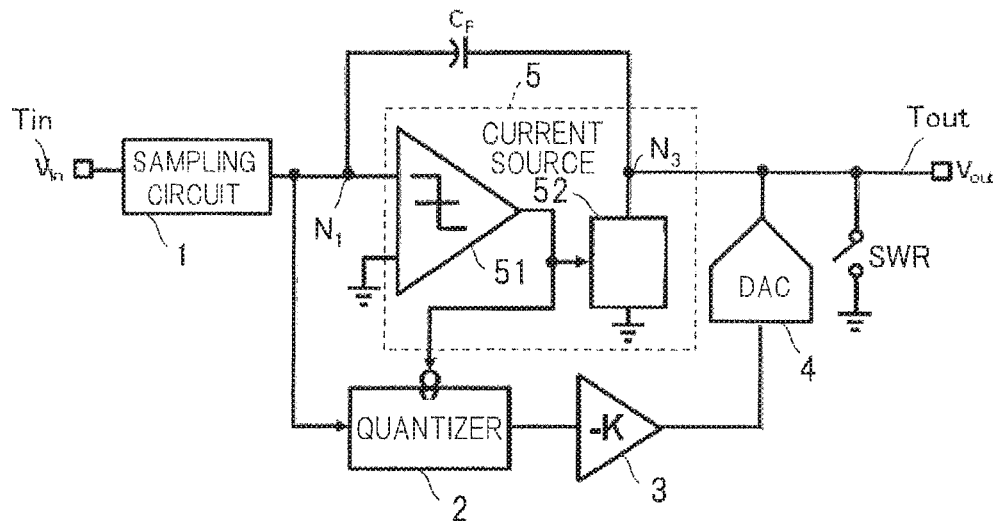
FIG. 28 is a diagram showing an example of an amplifier circuit according to a sixth embodiment.

An amplifier circuit according to a sixth embodiment will be explained referring to FIG. 28. The amplifier circuit according to the present embodiment is realized by using a comparator in the amplifier circuit according to the fifth embodiment. FIG. 28 is a diagram showing an example of an amplifier circuit according to the present embodiment. As shown in FIG. 28, the amplifier 5 of this amplifier circuit has a comparator 51 and a current source 52. The other components are similar to those of the fifth embodiment.

One input terminal of the comparator 51 (second comparator) is connected to the node $N_1$ and the other input terminal thereof is grounded. In the amplification phase, the comparator 51 compares $V_X$ with 0 and outputs a digital signal (0 or 1) depending on the comparison result.

In the present embodiment, the output signal of the comparator 51 is inputted into the quantizer 2 and utilized to switch between the first amplification phase and second amplification phase. After the amplifying operation of the amplifier 5 terminates, the output signal of the comparator 51 changes from 1 to 0. The quantizer 2 starts its operation after the output signal of the comparator 51 changes from 1 to 0 (or from 0 to 1).

The current source 52 supplies constant current depending on the output signal of the comparator 51. Due to the current source by the current source 52, the feedback capacitor $C_F$ is charged and amplifying operation by the amplifier 5 is realized.

Based on the above configuration, the amplifier circuit of the fifth embodiment can be realized. In the present embodiment, the error voltage Verror depending on the delay time $T_D$ of the comparator 51 occurs after the operation of the amplifier 5. This error voltage Verror is cancelled when the DAC 4 outputs an analog signal depending on the error voltage Verror. Therefore, the input voltage Vin can be amplified with high accuracy.

Seventh Embodiment

Figure 29:
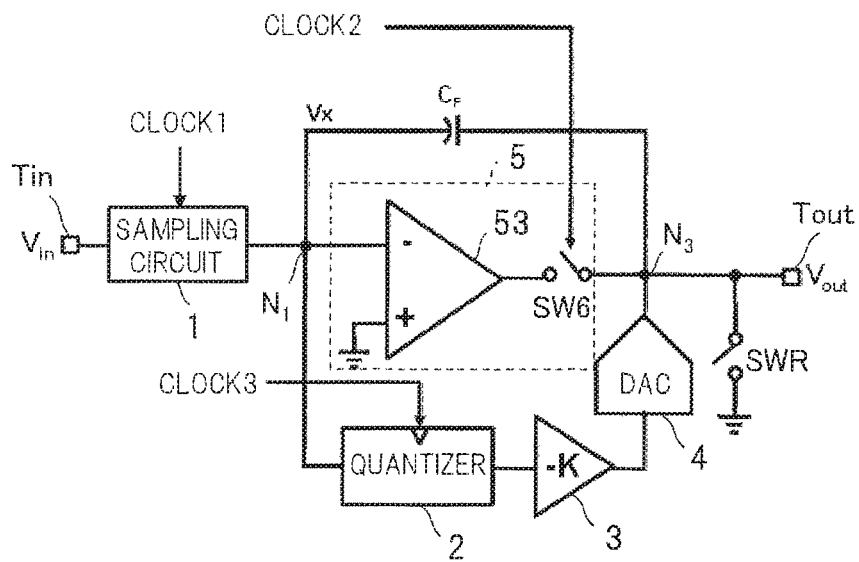
FIG. 29 is a diagram showing an example of an amplifier circuit according to a seventh embodiment.

An amplifier circuit according to a seventh embodiment will be explained referring to FIGS. 29 to 33. The amplifier circuit according to the present embodiment is realized by using an operational amplifier in the amplifier circuit according to the fifth embodiment. FIG. 29 is a diagram showing an example of an amplifier circuit according to the present embodiment. As shown in FIG. 29, the amplifier 5 of this amplifier circuit has an operational amplifier 53 and a switch SW6. The other components are similar to those of the fifth embodiment.

The inverting input terminal of the operational amplifier 53 is connected to the node $N_1$ and the non-inverting input terminal thereof is grounded. In the first amplification phase, the operational amplifier 53 amplifies the difference between $V_X$ and 0. Due to the operation of the operational amplifier 53, the charge $Q_{CS}$ stored in the sampling capacitor $C_S$ is transferred to the feedback capacitor $C_F$.

Figure 30:
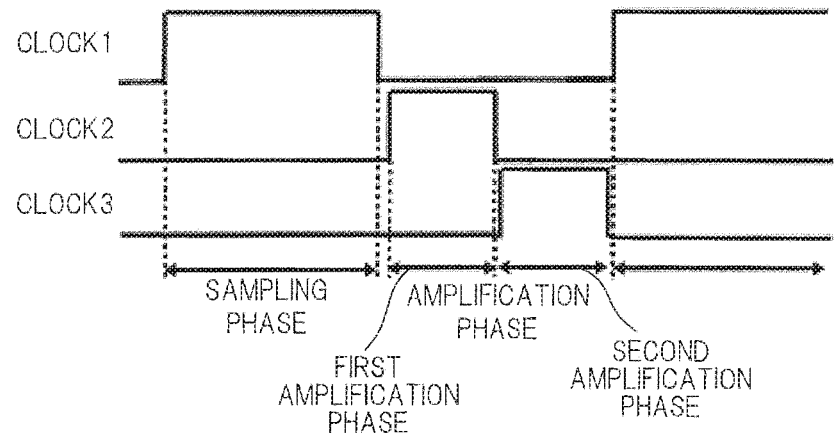
FIG. 30 is a timing chart showing the operation of the amplifier circuit of FIG. 29.

The switch SW6 (third switch) is a switch for switching between the first amplification phase and second amplification phase. In the first amplification phase, the switch SW6 is turned on to make the operational amplifier 53 operate. Further, in the second amplification phase and sampling phase, the switch SW6 is turned off to stop the output from the operational amplifier 53. The switch SW6 is opened/closed based on the control by a clock 2 for the first amplification phase. In the example of FIG. 30, the switch SW6 is connected between the output terminal of the operational amplifier 53 and the node $N_3$.

In the conventional amplifier circuit, two clocks, which are a clock for the sampling phase and a clock for the amplification phase, are inputted into the amplifier circuit in order to switch between the sampling phase and amplification phase.

This can be similarly applied to the sixth embodiment. In the sixth embodiment, the sampling phase is effective while the clock for the sampling phase is turned on, and the amplification phase is effective while the clock for the amplification phase is turned on. As stated above, the output signal of the comparator 51 switches between the first amplification phase and second amplification phase in the amplification phase.

On the other hand, in the present embodiment, as shown in FIG. 30, three clocks, which are a clock 1 for the sampling phase, a clock 2 for the first amplification phase, and a clock 3 for the second amplification phase, are inputted into the amplifier circuit. This is because it is difficult for the operational amplifier 53 to judge the end of operation from the output signal, differently from the comparator 51. The three clocks are generated using a delay-locked loop (DLL) etc.

Based on the above configuration, the amplifier circuit of the fifth embodiment can be realized. In the present embodiment, the error voltage Verror depending on the finite gain of the operational amplifier 53 occurs after the operation of the amplifier 5. This error voltage Verror is cancelled when the DAC 4 outputs an analog signal depending on the error voltage Verror. Therefore, the input voltage Vin can be amplified with high accuracy.

Figure 31:
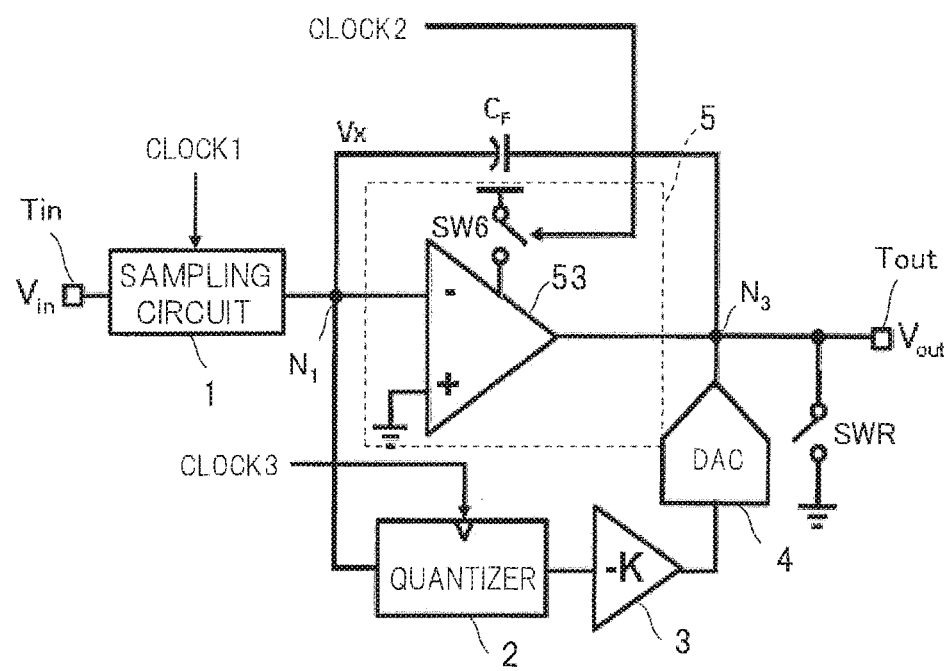
FIG. 31 is a diagram showing a modification example of the amplifier circuit of FIG. 29.

FIG. 31 is a diagram showing a modification example of the amplifier circuit according to the present embodiment. In the example of FIG. 31, the switch SW6 is provided on a power-supply line of the operational amplifier 53 in order to connect and disconnect the power source of the operational amplifier 53. With such a configuration, the power source of the operational amplifier 53 is disconnected in the second amplification phase and sampling phase, which makes it possible to reduce the power consumption of the operational amplifier 53. Note that the switch SW6 may be connected at an arbitrary part where it can control the operation of the operational amplifier 53. For example, the switch SW6 may be connected between the operational amplifier 53 and ground line, or may be connected to open the current source for driving the operational amplifier 53.

Figure 32:
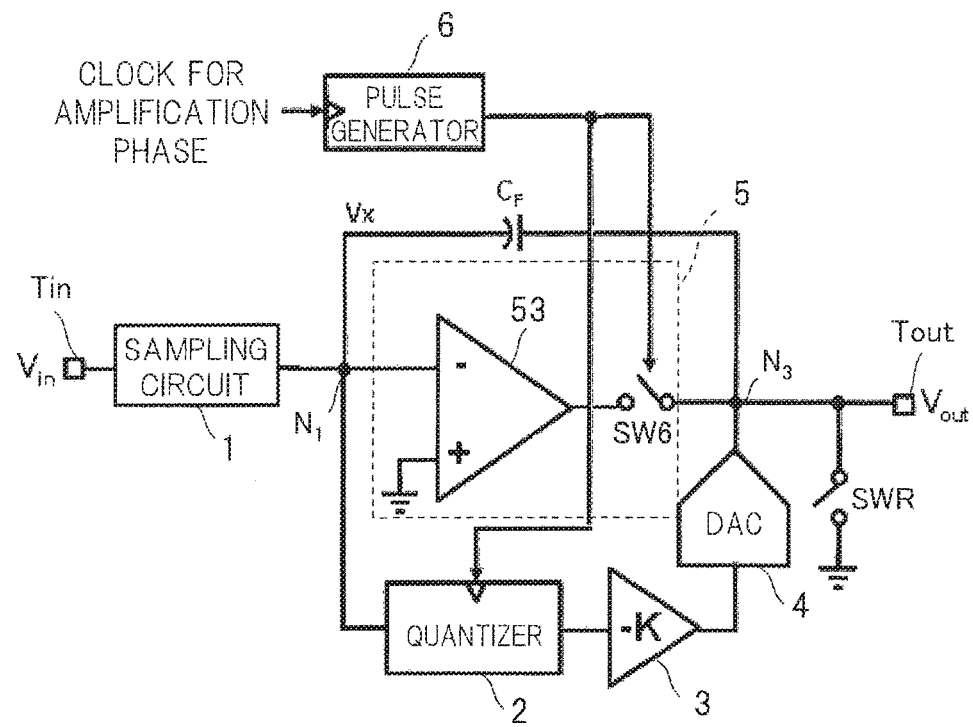
FIG. 32 is a diagram showing a modification example of the amplifier circuit of FIG. 29.

FIG. 32 is a diagram showing another modification example of the amplifier circuit according to the present embodiment. In the example of FIG. 32, the amplifier circuit has a pulse generator 6. The other components are similar to those of FIG. 29.

The pulse generator 6 is inputted with a clock for the amplification phase and generates the clock 2 for the first amplification phase from the inputted clock. The first amplification phase is effective while the clock 2 generated by the pulse generator 6 is turned on, and the second amplification phase is effective after the clock 2 is turned off and before the clock for the sampling phase is turned on.

Figure 33:
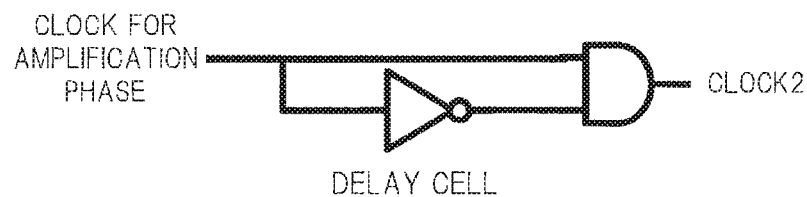
FIG. 33 is a diagram showing an example of a pulse generator of FIG. 32.

FIG. 33 is a diagram showing an example of the pulse generator 6. The pulse generator 6 of FIG. 33 has a delay cell and an AND gate. The delay cell delays the signal inputted thereto by a predetermined time, and outputs an inverted signal.

The clock for the amplification phase to be inputted into the pulse generator 6 is inputted also into the delay cell and one input terminal of the AND gate. Further, the output signal from the delay cell is inputted into the other input terminal of the AND gate. Accordingly, when the clock for the amplification phase is inputted into the pulse generator 6, the clock 2 having a duration of the delay time of the delay cell is outputted from the output terminal of the AND gate.

As stated above, using the delay cell to switch between the first amplification phase and second amplification phase makes it possible to reduce the power consumption of the amplifier circuit compared to the case where a plurality of clocks are generated using a delay-locked loop etc.

Eighth Embodiment

Figure 34:
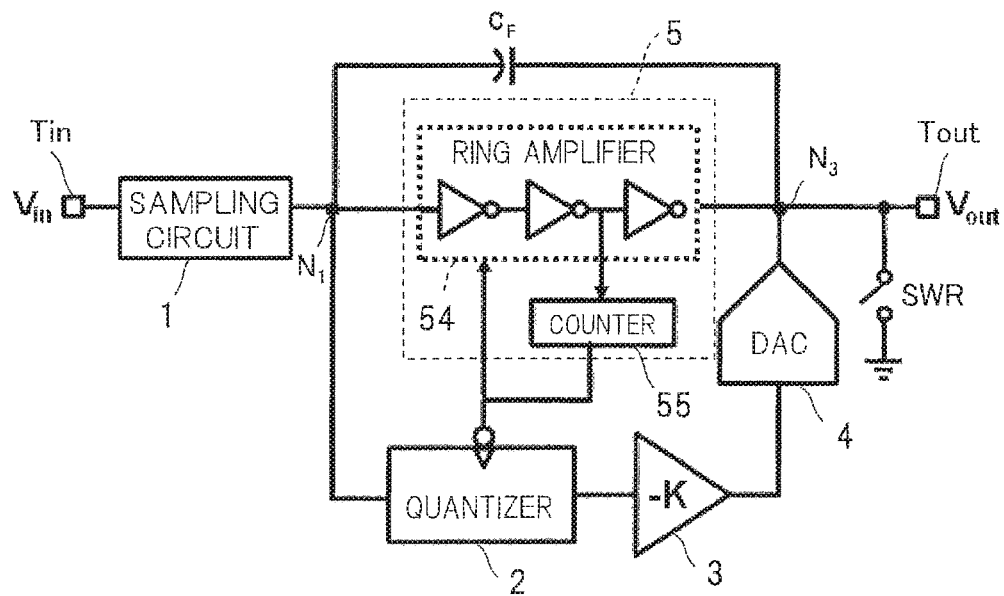
FIG. 34 is a diagram showing an example of an amplifier circuit according to an eighth embodiment.

An amplifier circuit according to an eighth embodiment will be explained referring to FIG. 34. The amplifier circuit according to the present embodiment is realized by using a ring amplifier in the amplifier circuit according to the fifth embodiment. FIG. 34 is a diagram showing an example of an amplifier circuit according to the present embodiment. As shown in FIG. 34, the amplifier 5 of this amplifier circuit has a ring amplifier 54 and a counter 55. The other components are similar to those of the fifth embodiment.

The ring amplifier (ring oscillator) 54 is connected between the node $N_1$ and node $N_3$. The ring amplifier 54 is formed of a plurality of the delay cells connected in a ring shape, and oscillates at a predetermined frequency.

The counter 55 counts the number of oscillations of the ring amplifier 54. When the number of oscillations reaches a predetermined value, the counter 55 stops the operation of the ring amplifier 54 and starts the operation of the quantizer 2. That is, in the present embodiment, the counter 55 functions as a control circuit for switching between the first amplification phase and second amplification phase.

Based on the above configuration, the amplifier circuit of the fifth embodiment can be realized. In the present embodiment, the error voltage Verror depending on the finite gain of the ring amplifier 54 occurs after the operation of the amplifier 5. This error voltage Verror is cancelled when the DAC 4 outputs an analog signal depending on the error voltage Verror. Therefore, the input voltage Vin can be amplified with high accuracy.

Note that in the example of FIG. 34, the switch between the first amplification phase and second amplification phase is controlled by the counter 55, but it may be controlled by a clock similarly to the seventh embodiment. In this case, the amplifier circuit may omit the counter 55.

Further, when the operation of the ring amplifier 54 is stable, the second amplification phase may be started after a predetermined time has passed since the first amplification phase started, without using the counter 55 and clock.

Ninth Embodiment

Figure 35:
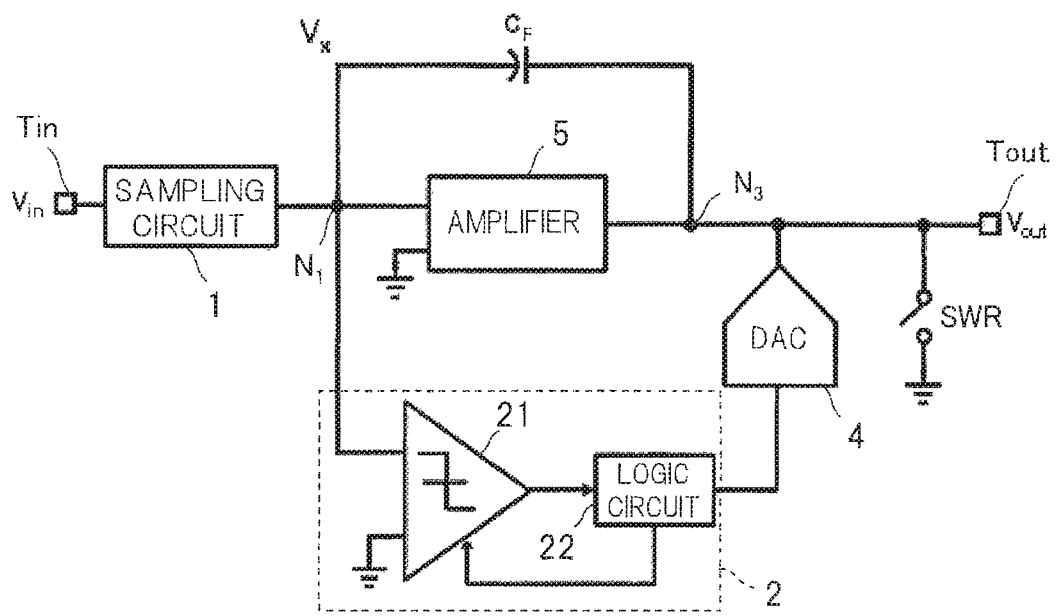
FIG. 35 is a diagram showing an example of an amplifier circuit according to a ninth embodiment.

An amplifier circuit according to a ninth embodiment will be explained referring to FIGS. 35 to 39. The amplifier circuit according to the present embodiment is realized by using an SAR-ADC in the amplifier circuit according to the fifth embodiment. FIG. 35 is a diagram showing an example of an amplifier according to the present embodiment. As shown in FIG. 35, this amplifier circuit is obtained by adding the amplifier 5 to the amplifier circuit according to the second embodiment. The amplifier 5 is formed similarly to the fifth embodiment.

Figure 36:
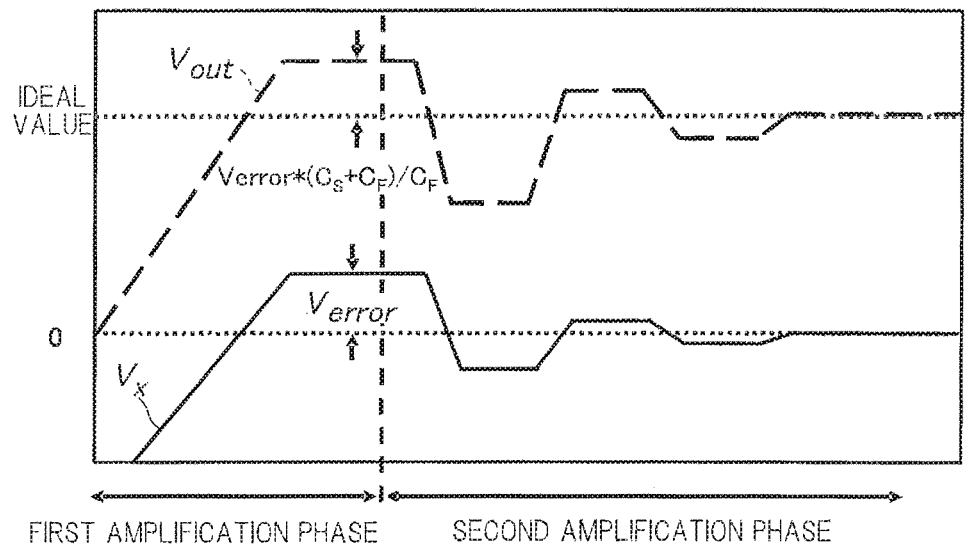
FIG. 36 is a graph showing the output voltage of the amplifier circuit of FIG. 35 in the amplification phase.

The operation of this amplifier circuit will be explained referring to FIG. 36. In the sampling phase, this amplifier circuit operates similarly to the first embodiment. Further, similarly to the fifth embodiment, the amplification phase consists of the first amplification phase and second amplification phase.

In the first amplification phase, the amplifier 5 operates to perform rough amplification on the output voltage $V_X$. As a result, as shown in FIG. 36, the error voltage Verror occurs in the output voltage $V_X$, and an amplification error of VerrorX$(C_S+C_F)/C_F$ occurs with respect to the ideal value.

In the second amplification phase, the quantizer 2 (SAR-ADC) carries out successive approximation operation, by which the output voltage $V_X$ approaches 0, the output voltage Vout approaches the ideal value, and amplification accuracy is improved.

As explained above, in the amplifier circuit according to the present embodiment, rough amplification is performed by the amplifier 5 in the first amplification phase, and then the output voltage $V_X$ is made to approach 0 by a method similar to the second embodiment in the second amplification phase. Since a method similar to the second embodiment is used to improve amplification accuracy, an amplifier circuit of low power consumption and high accuracy can be realized.

Further, the input range required for the comparator 21 of the quantizer 2 can be made considerably narrow compared to the first embodiment, which makes it possible to ease the design of the amplifier circuit.

Further, since only the error voltage Verror has to be cancelled, the level of the analog signal required for the DAC 4 (e.g., the amount of charge to be outputted from DAC 4) can be considerably lowered compared to the second embodiment. Therefore, the amplifier circuit can be designed easily.

Figure 37:
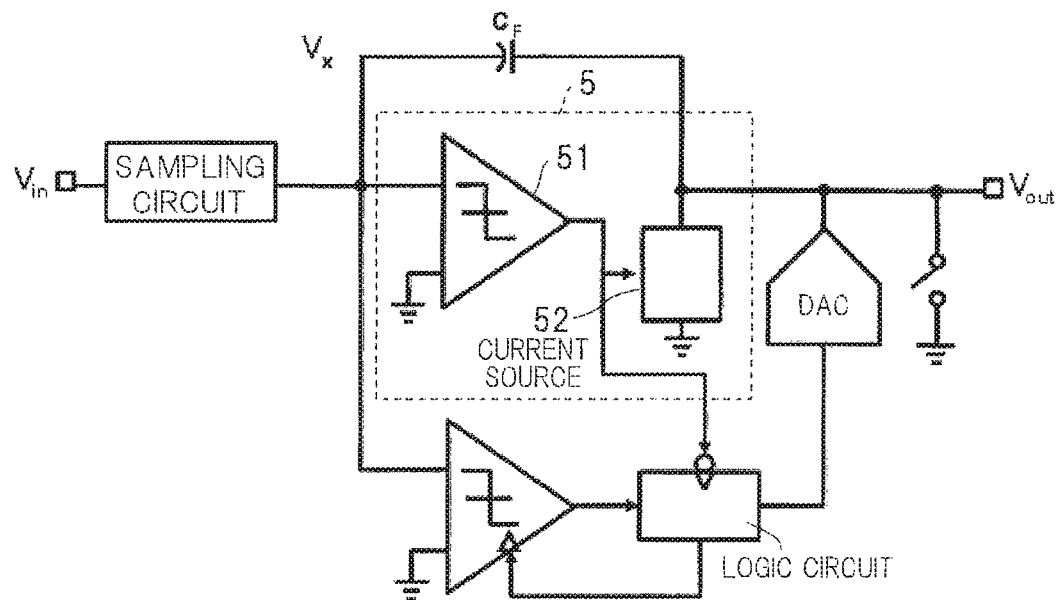
FIG. 37 is a diagram showing a concrete example of the amplifier circuit of FIG. 35.

Note that the amplifier 5 of the amplifier circuit according to the present embodiment may be formed using the comparator 51 and current source 52, as shown in FIG. 37. The amplifier circuit of FIG. 37 corresponds to the amplifier circuit according to the sixth embodiment, which is formed using an SAR-ADC.

Figure 38:
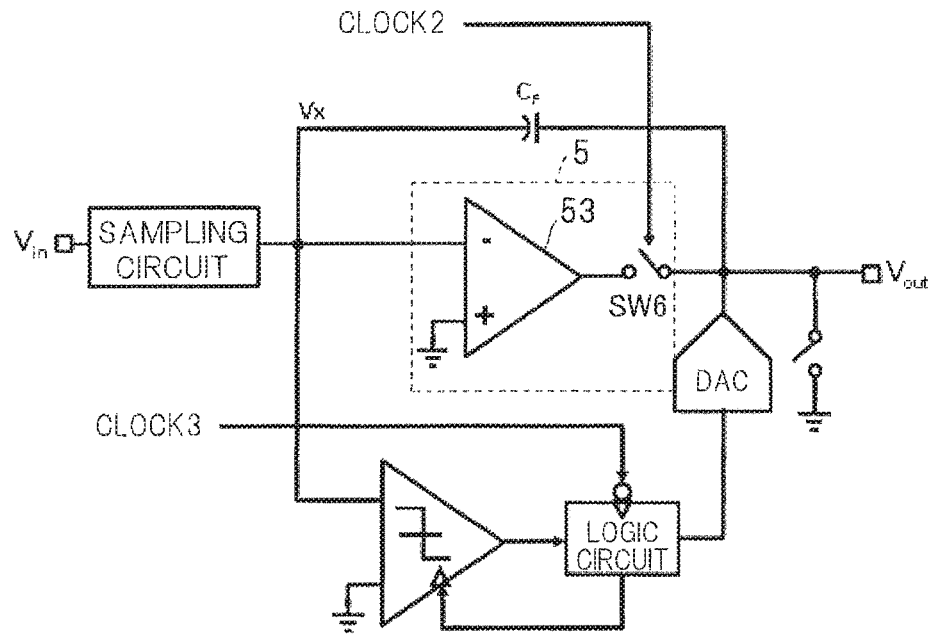
FIG. 38 is a diagram showing a concrete example of the amplifier circuit of FIG. 35.

Further, the amplifier of the amplifier circuit according to the present embodiment 5 may be formed using the operational amplifier 53 and switch SW6 as shown in FIG. 38. The amplifier circuit of FIG. 38 corresponds to the amplifier circuit according to the seventh embodiment, which is formed using an SAR-ADC.

Figure 39:
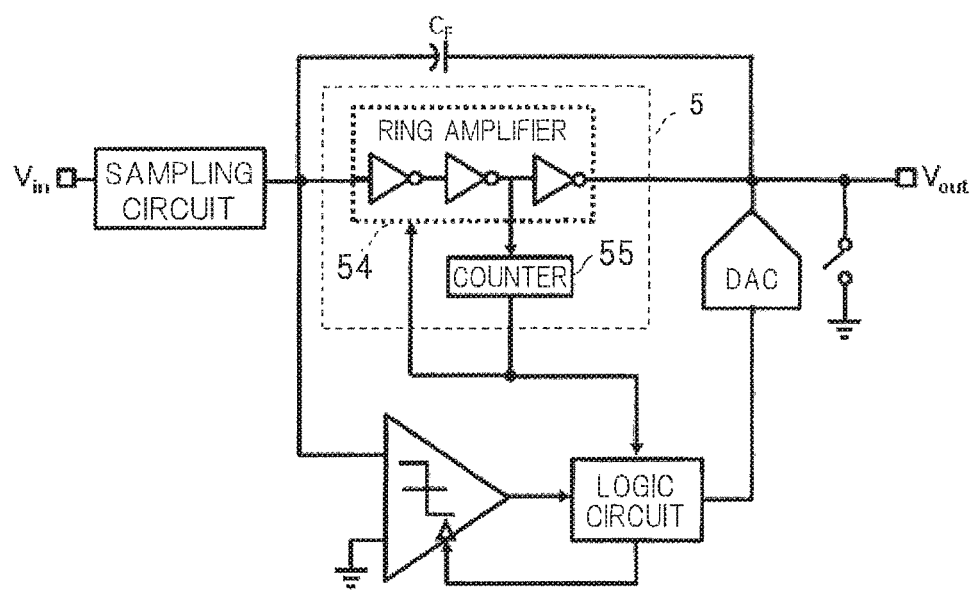
FIG. 39 is a diagram showing a concrete example of the amplifier circuit of FIG. 35.

Further, the amplifier of the amplifier circuit 5 according to the present embodiment may be formed using the ring amplifier 54 and counter 55, as shown in FIG. 39. The amplifier circuit of FIG. 39 corresponds to the amplifier circuit according to the eighth embodiment, which is formed using an SAR-ADC.

Tenth Embodiment

An ADC according to a tenth embodiment will be explained referring to FIG. 40. The ADC according to the present embodiment is a pipeline ADC having an amplifier circuit according to any one of the above embodiments.

Figure 40:
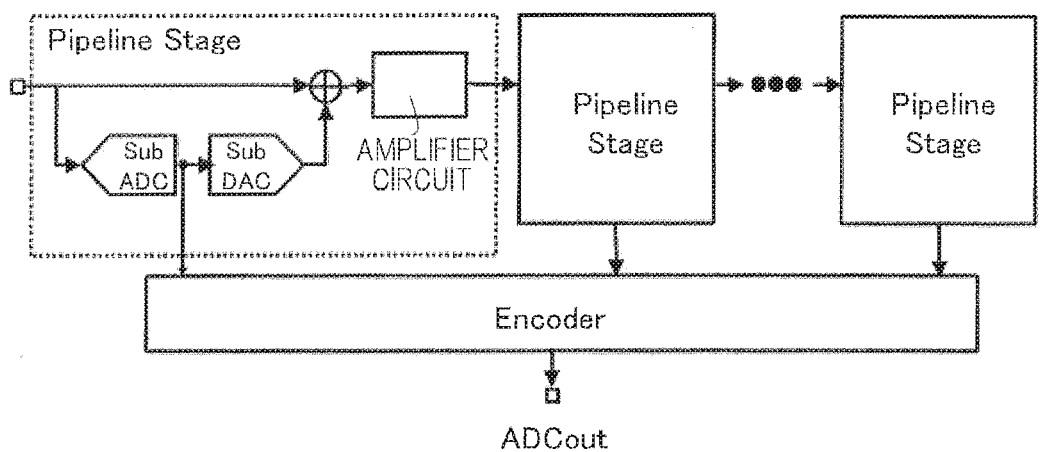
FIG. 40 is a diagram showing an example of an AD converter according to a tenth embodiment.

FIG. 40 is a diagram showing an example of a pipeline ADC according to the present embodiment. As shown in FIG. 40, this pipeline ADC has a plurality of pipeline stages connected in cascade, and an encoder which encodes the output signal from each pipeline stage and outputs a digital code ADCout as a result of AD conversion.

Each pipeline stage has a sub-ADC, a sub-DAC, a residual calculation circuit (subtracter), and an amplifier circuit.

The sub-ADC performs AD conversion on the analog signal inputted into the pipeline stage and inputs the result of AD conversion into the encoder and sub-DAC. The sub-DAC performs DA conversion on the AD conversion result inputted thereto and outputs an analog signal. The residual calculation circuit subtracts the analog signal outputted from the sub-DAC from the analog signal inputted into the pipeline stage, and outputs a residual signal. The amplifier circuit amplifies the residual signal outputted from the residual calculation circuit, and inputs the amplified signal into the next pipeline stage.

The pipeline ADC according to the present embodiment has an amplifier circuit according to any one of the above embodiments as an amplifier circuit for amplifying the residual signal. Such a configuration makes it possible to improve the AD conversion accuracy of the pipeline ADC while reducing power consumption.

Eleventh Embodiment

An ADC according to an eleventh embodiment will be explained referring to FIG. 41. The ADC according to the present embodiment is a delta-sigma ADC having an amplifier circuit according to any one of the above embodiments.

Figure 41:
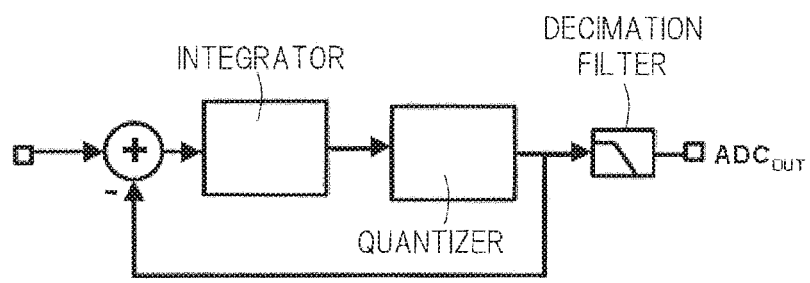
FIG. 41 is a diagram showing an example of an AD converter according to an eleventh embodiment.

FIG. 41 is a diagram showing an example of a delta-sigma ADC according to the present embodiment. As shown in FIG. 41, this delta-sigma ADC has a subtracter, an integrator, a quantizer, and a decimation filter.

The subtracter subtracts the output signal of the quantizer from the analog signal inputted thereto, and outputs a differential signal. The integrator integrates the differential signal outputted from the subtracter. The quantizer quantizes the integral value obtained by the integrator. The output signal of the quantizer has a pulse having a density depending on the level of the inputted analog signal. The decimation filter removes high frequency components from the output signal of the quantizer, and outputs the digital code ADCout as a result of AD conversion.

In the delta-sigma ADC according to the present embodiment, the integrator for integrating the differential signal has an amplifier circuit according to any one of the above embodiments. Such a configuration makes it possible to improve the AD conversion accuracy of the delta-sigma ADC while reducing power consumption.

Similarly to the third embodiment and fourth embodiment, the amplifier circuit according to each of the above embodiments can be used as an integrator by additionally using the switches SW4 and SW5 for making the feedback capacitor $C_F$ enter a floating state.

Twelfth Embodiment

A wireless communication device according to a twelfth embodiment will be explained referring to FIGS. 42 to 45. The wireless communication device according to the present embodiment has an amplifier circuit according to any one of the above embodiments.

Figure 42:
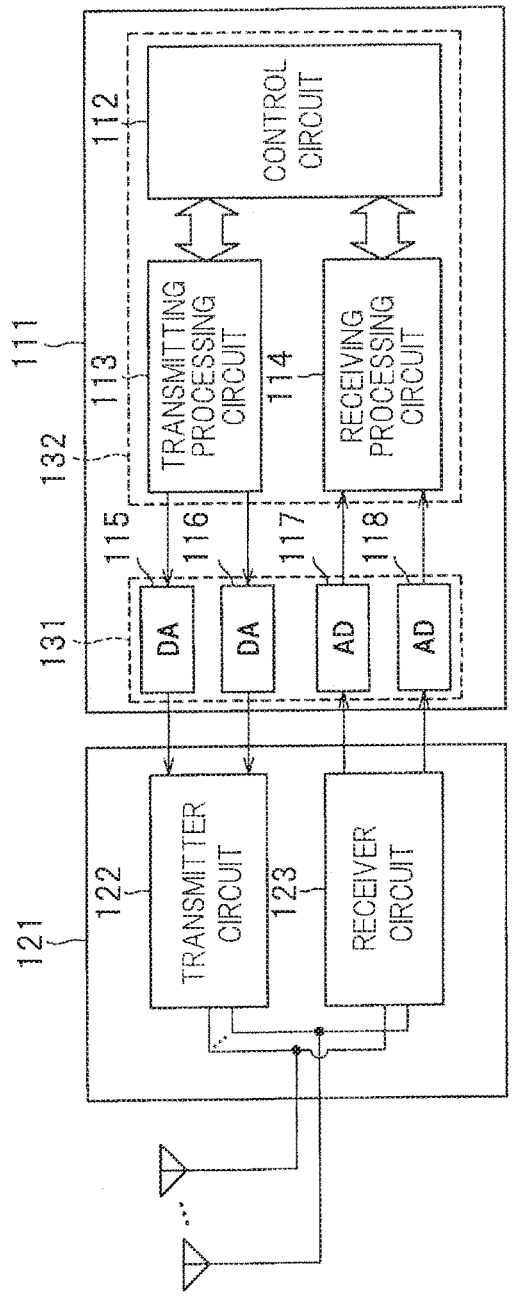
FIG. 42 is a diagram showing a hardware configuration of a wireless communication device according to a twelfth embodiment.

FIG. 42 is a diagram showing a hardware configuration of a wireless communication device according to the present embodiment. This hardware configuration is shown merely as an example and may be variously changed.

As shown in FIG. 42, the wireless communication device according to the present embodiment has a baseband unit 111, an RF unit 121, and antennas.

The baseband unit 111 has a control circuit 112, a transmitting processing circuit 113, a receiving processing circuit 114, DA converters 115 and 116, and ADCs 117 and 118.

The RF unit 121 and baseband unit 111 may be formed in an integrated circuit (IC) on the same chip, or may be formed on different chips respectively.

The baseband unit 111 is e.g. a baseband LSI or a baseband IC of one chip. Further, as shown by broken lines in FIG. 42, the baseband unit 111 may have ICs 131 and 132 mounted on two chips. In the example of FIG. 42, the IC 131 has the DA converters 115 and 116 and the ADCs 117 and 118. The IC 132 has the control circuit 112, transmitting processing circuit 113, and receiving processing circuit 114. The components to be included in each IC should not be limited to FIG. 42. Further, the baseband unit 111 may be formed of three or more ICs.

The control circuit 112 performs a process concerning the communication with another terminal (including a base station). Concretely, the control circuit 112 handles three types of MAC frames, which are a data frame, a control frame, and a management frame, and carries out various processes specified in the MAC layer. Further, the control circuit 112 may carries out a process for a layer upper than the MAC layer (e.g., TCP/IP layer, UDP/IP layer, or application layer upper than these layers).

The transmitting processing circuit 113 receives a MAC frame from the control circuit 112. The transmitting processing circuit 113 adds a preamble and a PHY header to the MAC frame and encodes and modulates the MAC frame. In this way, the transmitting processing circuit 113 converts the MAC frame into a PHY packet.

The DA converter 115/116 performs DA conversion on the PHY packet outputted from the transmitting processing circuit 113. In the example of FIG. 42, two DA converters are provided to achieve parallel processing, but the number of DA converters to be provided may be one or may be the same as the number of antennas.

The RF unit 121 is e.g. an RF analog IC or a high frequency IC mounted on one chip. The RF unit 121 may be mounted on one chip together with the baseband unit 111, or may be formed of two chips having thereon an IC having a transmitter circuit 122 and an IC having a receiving processing circuit respectively. The RF unit 121 has the transmitter circuit 122 and a receiver circuit 123.

The transmitter circuit 122 performs analog signal processing on the PHY packet which went through the DA conversion by the DA converter 115/116. The analog signal outputted from the transmitter circuit 122 is wirelessly transmitted through the antenna. The transmitter circuit 122 has a transmitting filter, a mixer, and a power amplifier (PA), for example.

The transmitting filter extracts a signal in a desired band from the signal of the PHY packet which went through the DA conversion by the DA converter 115/116. The mixer up-converts the signal filtered by the transmitting filter into a radio frequency by utilizing a signal at a constant frequency supplied from an oscillation device. A preamplifier amplifies the up-converted signal. The amplified signal is supplied to the antenna and a radio signal is transmitted therefrom.

The receiver circuit 123 performs analog signal processing on the signal received by the antenna. The signal outputted from the receiver circuit 123 is inputted into the ADCs 117 and 118. The receiver circuit 123 has an LNA (low noise amplifier), a mixer, and a receiving filter, for example.

The LNA amplifies the signal received by the antenna. The mixer down-converts the amplified signal into a baseband by utilizing a signal at a constant frequency supplied from the oscillation device. The receiving filter extracts a signal in a desired band from the down-converted signal. The extracted signal is inputted into the ADC 117/118.

The ADC 117/118 performs AD conversion on the signal inputted by the receiver circuit 123. In the example of FIG. 42, two ADCs are provided to achieve parallel processing, but the number of ADCs may be one or may be the same as the number of antennas.

In the present embodiment, the ADC 117/118 has an amplifier circuit according to any one of the above embodiments. The ADC 117/118 may be the ADC according to the tenth embodiment or the ADC according to the eleventh embodiment, for example. Such a configuration makes it possible to reduce the power consumption of the wireless communication device.

The receiving processing circuit 114 receives a PHY packet which went through the AD conversion by the ADC 117/118. The receiving processing circuit 114 demodulates and decodes the PHY packet, and removes a preamble and a PHY header from the PHY packet. In this way, the receiving processing circuit 114 converts the PHY packet into a MAC frame. The frame processed by the receiving processing circuit 114 is inputted into the control circuit 112.

Note that in the example of FIG. 42, the DA converters 115 and 116 and ADCs 117 and 118 are arranged in the baseband unit 111, but those may be arranged in the RF unit 121.

Figure 43:
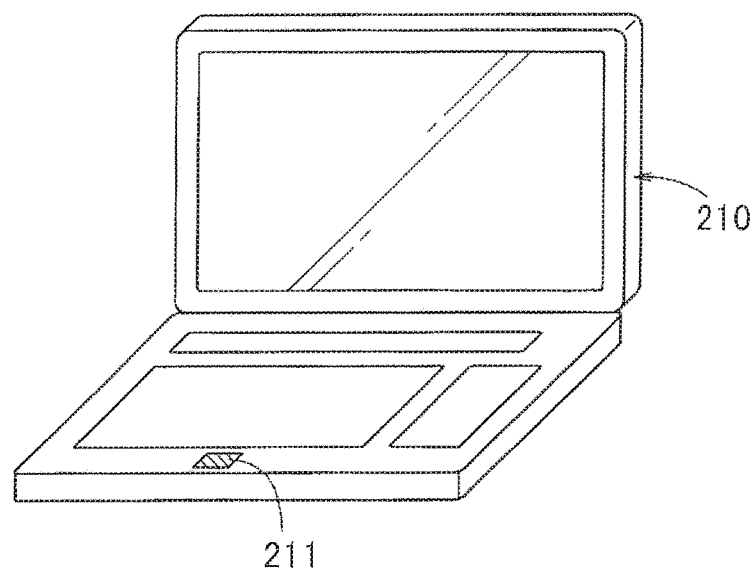
FIG. 43 is a perspective diagram showing a notebook PC having the wireless communication device of FIG. 42.
Figure 44:
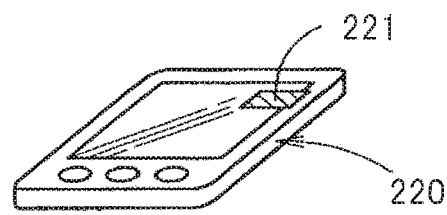
FIG. 44 is a perspective diagram showing a mobile communication terminal having the wireless communication device of FIG. 42.

Each of FIG. 43 and FIG. 44 is a perspective diagram showing a radio communication terminal having the above wireless communication device. The radio communication terminal of FIG. 43 is a notebook PC 10, and the radio communication terminal of FIG. 44 is a mobile terminal 20. The notebook PC 10 and mobile terminal 20 have wireless communication devices 11 and 21 as explained above, respectively.

Note that the radio communication terminal having the wireless communication device should not be limited to the notebook PC and mobile terminal. The wireless communication device can be mounted on, e.g., TV, digital camera, wearable device, tablet, smartphone, game device, network storage device, monitor, digital audio player, Web camera, video camera, project, navigation system, external adapter, internal adapter, set-top box, gateway, printer server, mobile access point, router, enterprise/service provider access point, portable device, handheld device, etc.

Figure 45:
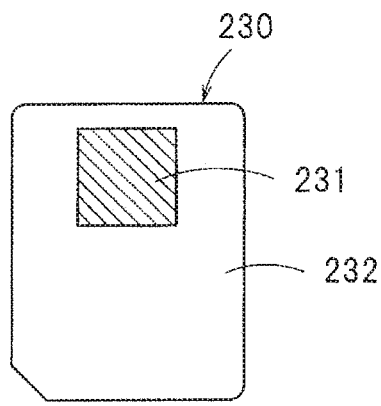
FIG. 45 is a plane view showing a memory card having the wireless communication device of FIG. 42.

Further, the wireless communication device can be mounted on a memory card. FIG. 45 is a plane view showing a memory card 30 having the above wireless communication device. The memory card 30 has a wireless communication device 31 and a memory card main body 32. The memory card 30 utilizes the wireless communication device 31 to wirelessly communicate with an external device (such as a radio communication terminal and a base station). Note that, in FIG. 45, the other elements (memory etc.) in the memory card 30 are omitted.

Thirteenth Embodiment

A sensor system according to a thirteenth embodiment will be explained referring to FIG. 46. The sensor system according to the present embodiment has an amplifier circuit according to any one of the above embodiments.

Figure 46:
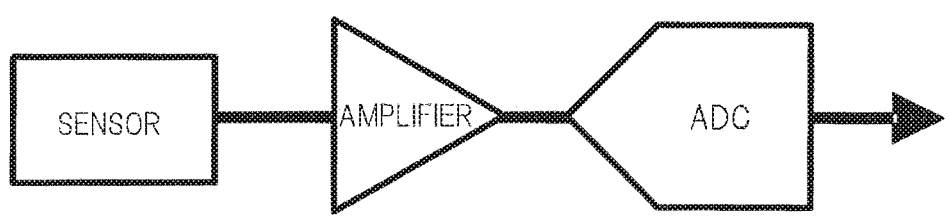
FIG. 46 is a diagram showing an example of a sensor system according to a thirteenth embodiment.

FIG. 46 is a diagram showing an example of a sensor system according to the present embodiment. As shown in FIG. 46, this sensor system has a sensor, an amplifier, and an ADC. The sensor outputs an electrical signal depending on the physical quantity sensed thereby. The sensor can be arbitrarily selected from various types of sensors such as a temperature sensor and an acceleration sensor.

The amplifier amplifies the electrical signal outputted from the sensor. As this amplifier, an amplifier circuit according to any one of the above embodiments may be utilized, which makes it possible to reduce the power consumption of the sensor system.

The ADC performs AD conversion on the signal amplified by the amplifier. As this ADC, an ADC having an amplifier circuit according to any one of the above embodiments (e.g., the ADC according to the tenth or eleventh embodiment) may be utilized, which makes it possible to reduce the power consumption of the sensor system.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An amplifier circuit, comprising:
    a sampling circuit including a sampling capacitor which samples an input voltage and a plurality of switches;
    a quantizer to quantize an output voltage of the sampling circuit;
    a DA converter to output an analog signal depending on a quantization signal by the quantizer, and
    a feedback capacitor to feed the analog signal back to the output voltage of the sampling circuit, the feedback capacitor being connected in series to the sampling capacitor.

2. The amplifier circuit of claim 1, further comprising a digital calculation circuit to multiply the quantization signal by −K and input the multiplied quantization signal into the DA converter.

3. The amplifier circuit of claim 1, wherein the quantizer is a successive approximation AD converter to comprise a first comparator which compares the output voltage of the sampling circuit with a ground voltage, and a logic circuit which controls the first comparator.

4. The amplifier circuit of claim 1, wherein the DA converter is a capacitor DAC or a resistance DAC.

5. The amplifier circuit of claim 1, further comprising a reset switch to reset the feedback capacitor.

6. The amplifier circuit of claim 1, further comprising:
    a first switch to be connected between the sampling circuit and the feedback capacitor, and
    a second switch to be connected between the feedback capacitor and the DA converter.

7. The amplifier circuit of claim 6, wherein the first switch is used also as a switch of a sampling circuit connected in a subsequent stage.

8. The amplifier circuit of claim 7,
    wherein the DA converter is a capacitor DAC to comprise a capacitor element, and
    the capacitor element is used also as a sampling capacitor of the sampling circuit connected in the subsequent stage.

9. The amplifier circuit of claim 1, further comprising an amplifier to amplify the output voltage of the sampling circuit and input the amplified voltage into the feedback capacitor.

10. The amplifier circuit of claim 9, wherein the amplifier comprises a second comparator to compare the output voltage of the sampling circuit with a ground voltage, and a current source to supply current to the feedback capacitor depending on an output signal of the second comparator.

11. The amplifier circuit of claim 9, wherein the amplifier comprises an operational amplifier to amplify the output voltage of the sampling circuit, and a third switch to stop an output of the operational amplifier.

12. The amplifier circuit of claim 11, wherein the third switch is connected between an output terminal of the operational amplifier and the feedback capacitor.

13. The amplifier circuit of claim 11, wherein the third switch is provided on a power-supply line of the operational amplifier.

14. The amplifier circuit of claim 11, further comprising a pulse generator to generate a clock which opens and closes the third switch.

15. The amplifier circuit of claim 9, wherein the amplifier comprises a ring amplifier to amplify the output voltage of the sampling circuit, and a counter to count the number of oscillations of the ring amplifier.

16. An AD converter comprising the amplifier circuit of claim 1.

17. A wireless communication device comprising the AD converter of claim 16.

18. A sensor system comprising the AD converter of claim 16.

* * * * *